US012804985B2

(12) United States Patent
Chuang et al.

(10) Patent No.: US 12,804,985 B2
(45) Date of Patent: Nov. 17, 2026

(54) VERTICAL SEMICONDUCTOR POWER DEVICE AND METHOD FOR MANUFACTURING THE SAME

(71) Applicant: Diodes Incorporated, Plano, TX (US)

(72) Inventors: Chiao-Shun Chuang, New Taipei City (TW); TaChuan Kuo, New Taipei City (TW)

(73) Assignee: Diodes Incorporated, Plano, TX (US)

( * ) Notice: Subject to any disclaimer, the term of this patent is extended or adjusted under 35 U.S.C. 154(b) by 417 days.

(21) Appl. No.: 18/235,126

(22) Filed: Aug. 17, 2023

(65) Prior Publication Data

US 2024/0194746 A1 Jun. 13, 2024

(30) Foreign Application Priority Data

Dec. 8, 2022 (CN) ......................... 202211574074.7

(51) Int. Cl.

| | |
|---|---|
| *H10D 64/00* | (2025.01) |
| *H10D 30/01* | (2025.01) |
| *H10D 30/60* | (2025.01) |
| *H10D 30/63* | (2025.01) |
| *H10D 30/66* | (2025.01) |
| *H10D 64/01* | (2025.01) |
| *H10D 64/23* | (2025.01) |
| *H10D 64/27* | (2025.01) |

(52) U.S. Cl.
CPC ....... *H10D 64/117* (2025.01); *H10D 30/0297* (2025.01); *H10D 30/668* (2025.01); *H10D 64/01* (2025.01)

(58) Field of Classification Search
CPC .... H10D 64/117; H10D 64/01; H10D 64/513; H10D 64/514; H10D 30/0297; H10D 30/025; H10D 30/611; H10D 30/63; H10D 30/668
See application file for complete search history.

(56) References Cited

U.S. PATENT DOCUMENTS

| | | | | |
|---|---|---|---|---|
| 10,340,346 | B2 * | 7/2019 | Katou | H10D 30/0297 |
| 11,489,070 | B2 * | 11/2022 | Kikuchi | H10D 30/668 |
| 2017/0365708 | A1 * | 12/2017 | Li | H10D 62/127 |

* cited by examiner

*Primary Examiner* — Kretelia Graham
*Assistant Examiner* — Moataz Khalifa
(74) *Attorney, Agent, or Firm* — AP3 Law Firm PLLC

(57) ABSTRACT

A vertical semiconductor power device is provided, which includes a substrate having a first surface and a second surface opposite to each other. A trench extends from the second surface toward the first surface. An in-trench dielectric layer is disposed along an inner surface of the trench. A shield electrode is disposed in the trench and is surrounded by the in-trench dielectric layer. A gate electrode is disposed in the in-trench dielectric layer and surrounds the shield electrode. The gate electrode is surrounded by the in-trench dielectric layer without adjoining the shield electrode and the substrate. A method for making the vertical semiconductor power device is also provided.

20 Claims, 20 Drawing Sheets

VERTICAL SEMICONDUCTOR POWER DEVICE AND METHOD FOR MANUFACTURING THE SAME

CROSS-REFERENCE TO RELATED APPLICATIONS

This patent application claims priority to Chinese Application No. 202211574074.7, filed on Dec. 8, 2022 and entitled "Vertical semiconductor power device and manufacturing method thereof," which is hereby incorporated by reference herein as if reproduced in its entirety.

TECHNICAL FIELD

The present disclosure relates to the field of semiconductor power device, and in particular embodiments, to a vertical semiconductor power device and a method for manufacturing the same, and particularly, to a vertical semiconductor power device with the gate electrode surrounded and covered by a dielectric layer in a trench.

BACKGROUND

A vertical semiconductor power device includes an array of trenches formed on the top surface of a substrate (semiconductor chip), where each of the trenches may be filled with a shield electrode. The array of trenches defines the corresponding mesa array, and components such as the doped region, the source region, the source contact, gate electrode, and so on, may be placed on top of the mesa. In existing technologies, due to the limitation of the minimum line width of photolithography, a large area is occupied between a trench and a source contact, which becomes a technical bottleneck for device miniaturization.

SUMMARY

Technical advantages are generally achieved, by embodiments of this disclosure which describe a vertical semiconductor power device and a method for manufacturing the same.

Embodiments of the present disclosure relate to a vertical power semiconductor device. The vertical power semiconductor device includes: a substrate, where the substrate has a first surface and a second surface opposite to each other, and the substrate has a doped region close to the second surface and has a first trench extending from the second surface to the first surface; a first in-trench dielectric layer arranged along the inner surface of the first trench; a first shield electrode, arranged in the first trench and is surrounded by the first in-trench dielectric layer; a first gate electrode, arranged in the first in-trench dielectric layer and around the first shield electrode, wherein the first gate electrode is wrapped by the first in-trench dielectric layer, such that the first gate electrode does not directly adjoin the first shield electrode and the substrate.

Embodiments of the disclosure relate to a method of manufacturing a vertical power semiconductor device. The method includes: forming a first trench in a substrate; forming a first in-trench dielectric layer in the first trench; forming a first shield electrode in the first trench, wherein the first shield electrode is surrounded by the first in-trench dielectric layer; removing partially the first in-trench dielectric layer; forming a first gate electrode in the first trench surrounding the first shield electrode, wherein the first gate electrode is surrounded and covered by the first in-trench dielectric layer, such that the first gate electrode does not directly adjoin the first shield electrode and the substrate.

According to one aspect of the present application, a vertical semiconductor power device is provided that includes a substrate, where the substrate has a first surface and a second surface opposite to each other, a doped region close to the second surface, and a first trench extending from the second surface toward the first surface. The vertical semiconductor power device further includes a first in-trench dielectric layer disposed along an inner surface of the first trench; and a first shield electrode, disposed in the first trench and surrounded by the first in-trench dielectric layer. The vertical semiconductor power device also includes a first gate electrode, disposed in the first in-trench dielectric layer and surrounding the first shield electrode, the first gate electrode being surrounded by the first in-trench dielectric layer without adjoining the first shield electrode and the substrate.

According to another aspect of the present application, a method for making a vertical semiconductor power device is provided, which includes: forming a first trench in a substrate; forming a first in-trench dielectric layer in the first trench; forming a first shield electrode in the first trench, the first shield electrode surrounded by the first in-trench dielectric layer; partially removing the first in-trench dielectric layer; and forming a first gate electrode in the first trench, the first gate electrode surrounding the first shield electrode, and the first gate electrode being surrounded by the first in-trench dielectric layer without adjoining the first shield electrode and the substrate.

Advantages of aspects of the present disclosure include reduced distance between trenches of a vertical semiconductor power device, reduced total surface area of the device, and reduced resistance of the device.

BRIEF DESCRIPTION OF THE DRAWINGS

Aspects of embodiments of the present disclosure may be best understood from the following detailed description in conjunction with the accompanying drawings. It should be noted that, various structures may not be drawn to scale. In fact, the dimensions of various structures may be enlarged or reduced on purpose for description clarity.

The technical solutions and beneficial effects of the present application will be made apparent through the detailed description of embodiments of the present application in conjunction with the accompanying drawings, in which.

The same or similar components are labeled with the same reference numerals in the drawings and detailed description. Embodiments of the present disclosure will be readily understood from the following detailed description taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The following disclosure provides various embodiments or examples for implementing different features of the presented disclosure. Embodiments of components and configurations are described in the following. Certainly, these are examples only and are not intended to be limiting. In the present disclosure, a reference to forming a first feature on or over a second feature may include an embodiment where the first feature and the second feature are in direct contact, and may also include an embodiment where an additional feature is formed between the first feature and the second feature such that the first feature and the second feature are not in direct contact. Additionally, the present disclosure may repeat symbols and/or letters of the accompanying drawings in various embodiments. Such repetition is for simplicity and clarity, and does not in itself indicate relationships between various embodiments and/or configurations discussed.

Embodiments of the present disclosure are discussed in detail below. However, it should be appreciated that the present disclosure provides applicable concepts that may be embodied in a wide variety of specific contexts. The specific embodiments discussed are illustrative only, and do not limit the scope of the present disclosure.

The present disclosure provides a vertical semiconductor power device and a manufacturing method thereof. The terms "vertical semiconductor power device" and "vertical power semiconductor device" may be used interchangeably in the disclosure. In the disclosed vertical semiconductor power device, gate electrodes are placed in trenches, which shortens the distance between the trenches and reduces the total surface area of the device. As an example, compared with examples where the gate electrodes are placed between the trenches, the distance between the trenches can be shortened by at least 6%, and the total surface area of the device can be reduced by at least 10%. In addition, in the vertical semiconductor power device of the present disclosure, the gate electrodes in the trenches are coupled to the inactive area through gate electrode connectors, which can achieve the effect of reducing the resistance of the device.

Figure 1A:
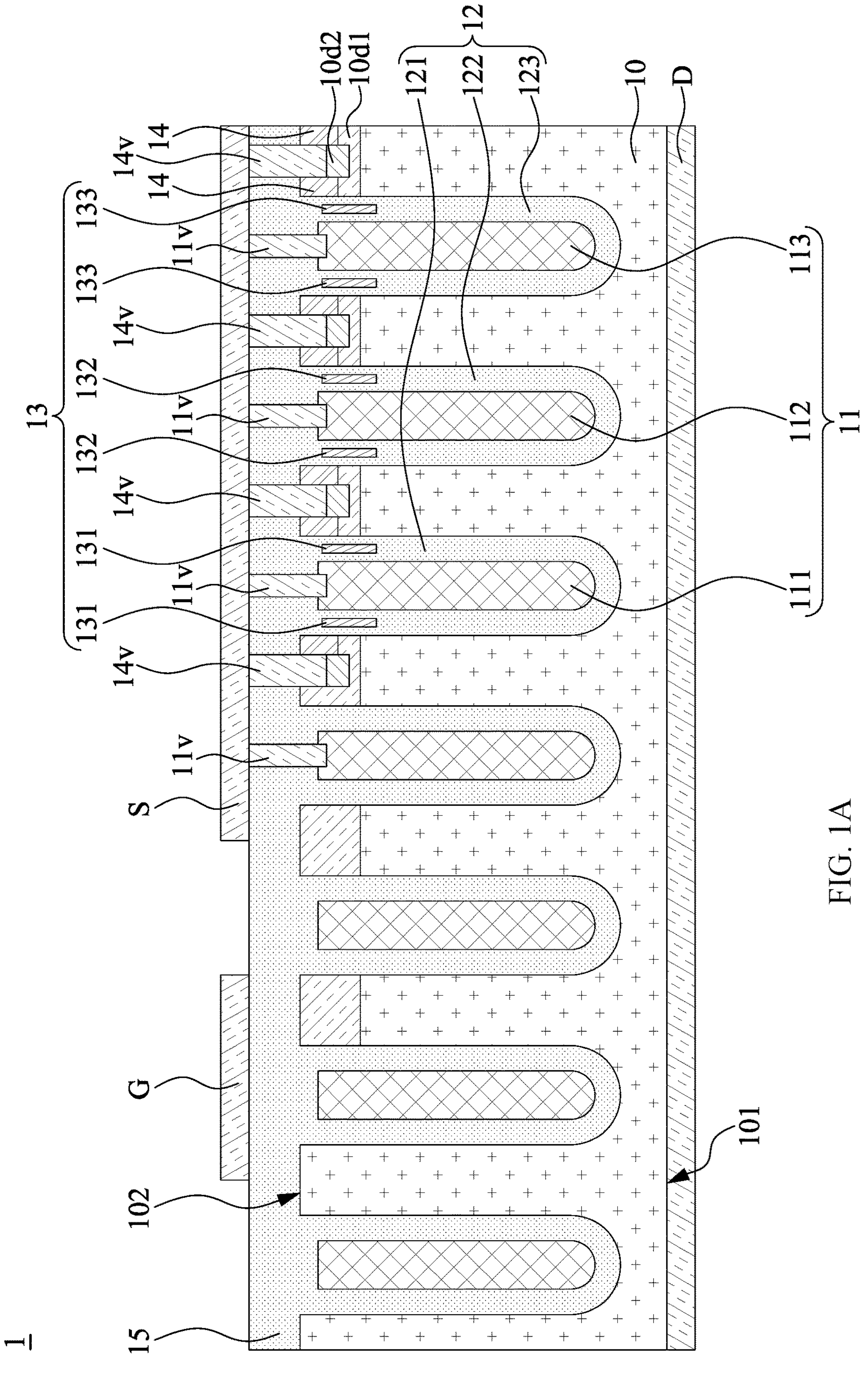
FIG. 1A is a cross-sectional view of an example vertical power semiconductor device according to some embodiments of the present application.

FIG. 1A is a cross-sectional view of an example vertical semiconductor power device 1 according to some embodiments of the present application. The vertical semiconductor power device 1 may be a semiconductor power device of different types or manufactured by different technologies. For example, the vertical semiconductor power device 1 may include a power metal-oxide semiconductor field-effect transistor (MOSFET), double-diffused MOSFET (DMOSFET), insulated-gate bipolar transistor (IGBT), junction gate field-effect transistor (JFET), power bipolar transistor or power diodes (such as power Schottky diodes). Specifically, the vertical semiconductor power device 1 has a vertical current conduction path. For example, the current of the vertical semiconductor power device 1 may flow in a direction that is perpendicular to the active surface of the vertical semiconductor power device 1. As an example, the current of the vertical semiconductor power device 1 may be conducted vertically passing through the vertical semiconductor power device 1.

In some embodiments, the vertical semiconductor power device 1 may include a substrate 10, a shield electrode 11 (e.g., shield electrodes 111, 112, 113, collectively referred to as the shield electrode 11 hereinafter), an in-trench dielectric layer 12 (e.g., in-trench dielectric layers 121, 22, 123, collectively referred to as the in-trench dielectric layer 12 hereinafter), a gate electrode 13 (e.g., gate electrodes 131, 132, 133, collectively referred to as the gate electrode 13 hereinafter), a source region 14, an interlayer dielectric layer 15, a drain metal layer D, a source metal layer S, and a gate metal layer G.

The substrate 10 may include a semiconductor substrate, e.g., an N-type or P-type single crystal silicon substrate, an epitaxial silicon substrate, an SOI (silicon on insulator) substrate, a silicon carbide (SiC) substrate, a germanium (Ge) substrate, a silicon germanium (SiGe) substrate, a gallium nitride (GaN) substrate, a gallium arsenide (GaAs) substrate, a gallium arsenide phosphide (GaAsP) substrate, or other semiconductor material substrates.

The substrate 10 may have a surface 101 and a surface 102 opposite to the surface 101. The surface 101 and surface 102 may be opposite sides of the substrate 10. The surface 101 and the surface 102 may be horizontal planes, and the direction perpendicular to the surface 101 and the surface 102 may be a vertical direction. In some embodiments, the surface 102 may be the active surface of the substrate 10.

The drain metal layer D may be located on the surface 101. The source metal layer S and the gate metal layer G may be located on the surface 102. The source metal layer S and the gate metal layer G may be spaced apart from each other. In some embodiments, the source metal layer S may be located in an active area. For example, in the vertical direction, the source metal layer S may overlap the device area. As an example, in the vertical direction, the source metal layer S may overlap the source region 14. As an example, in the vertical direction, the source metal layer S may overlap the gate electrode 13. In some embodiments, the gate metal layer G may be located in an inactive area or a non-active area. For example, in the vertical direction, the gate metal layer G may not overlap the device area. As an example, in the vertical direction, the gate metal layer G may not overlap the source region 14. As an example, in the vertical direction, the gate metal layer G may not overlap the gate electrode 13.

The drain metal layer D, the source metal layer S, and the gate metal layer G may each include conductive materials such as metal, metal alloy, or metal silicide, etc. Examples of the conductive materials may include gold (Au), silver (Ag), copper (Cu), platinum (Pt), palladium (Pd), tungsten (W), titanium (Ti), tantalum (Ta), molybdenum (Mo), other metals or alloys, or a combination of two or more thereof. The drain metal layer D, the source metal layer S and the gate metal layer G may provide electrical connections between the vertical semiconductor power device 1 and external devices (such as printed circuit boards (PCBs), other packages, electronic assemblies, or other devices).

The substrate 10 may have a drift region and a doped region 10*d*1 located above the drift region. The drift region may be located between the drain metal layer D and the doped region 10*d*1, and the doped region 10*d*1 may be close to the surface 102. The drift region and the doped region 10*d*1 may have opposite conductivity types. For example, the drift region may be doped with N-type impurities, and the doped region 10*d*1 may be doped with P-type impurities. Alternatively, the drift region may be doped with P-type impurities, and the doped region 10*d*1 may be doped with N-type impurities. For example, a P-N junction may be formed between the drift region and the doped region 10*d*1.

The vertical semiconductor power device 1 has a plurality of trenches extending from the surface 101 to the surface 102. The trenches may be in a shape of round, ellipse, rectangle or polygon. The trenches may extend through the doped region 10*d*1 and into the drift region. For example, the trenches may be partially located in the drift region. In some embodiments, the trenches may extend beyond the drift region. In some embodiments, the trenches may not extend beyond the drift region. In some embodiments, the trenches may form a trench array. In some implementations, a corresponding mesa may be defined between the trenches.

The shield electrode 11 may be located in the trenches. For example, each trench may have a corresponding shield electrode. The shield electrode 11 may include polysilicon (e.g., doped polysilicon), metal or metal alloy. The shield electrode 11 (e.g., each of the shield electrodes 111, 112, 113) may be coupled to the source metal layer S via a shield electrode vertical connector 11*v*. The shield electrode vertical connector 11*v* may vertically extend through the interlayer dielectric layer 15. For example, the shield electrode vertical connector 11*v* may extend vertically downward from the source metal layer S and through the interlayer dielectric layer 15, and contact the shield electrode 11. In some embodiments, the shield electrode 11 may improve the breakdown voltage from the source (e.g., the source region 14) to the drain (e.g., the drain metal layer D) and reduce the peak electric field.

The in-trench dielectric layer 12 may be located in the trenches. For example, each trench may have an inner surface (including opposite sidewalls and a bottom extending between the sidewalls), and the intra-trench dielectric layer 12 may be disposed along the inner surface of the trench. The in-trench dielectric layer 12 may surround the shield electrode 11. The in-trench dielectric layer 12 may be disposed between the shield electrode 11 and the substrate 10. For example, the in-trench dielectric layer 121 may separate the shield electrode 111 from the substrate 10. The in-trench dielectric layer 122 may separate the shield electrode 112 from the substrate 10. The in-trench dielectric layer 123 may separate the shield electrode 113 from the substrate 10.

The in-trench dielectric layer 12 may include silicon oxide, silicon nitride, silicon oxynitride, borophosphosilicate glass (BPSG), phosphosilicate glass (PSG), undoped silicon glass (USG), fluorosilicate glass (FSG) or spin-on glass (SOG).

The gate electrode 13 may be located in the trenches. For example, the gate electrode 13 may be located on a sidewall of a corresponding trench and close to the opening of the trench. The in-trench dielectric layer 12 may surround the gate electrode 13. As an example, the in-trench dielectric layer 121 may surround the gate electrode 131. For example, the inter-trench dielectric layer 121 may separate the gate electrode 131 from the substrate 10. For example, the in-trench dielectric layer 121 may separate the gate electrode 131 from the shield electrode 111. For example, the in-trench dielectric layer 121 may be in contact with, cover or wrap the gate electrode 131. For example, the in-trench dielectric layer 121 may cause the gate electrode 131 to not directly adjoin the substrate and the shield electrode 111.

The gate electrode 13 may surround the shield electrode 11. For example, the gate electrode 131 may surround the shield electrode 111. For example, the gate electrode 131 may be located around the shield electrode 111. For example, in the horizontal direction, the gate electrode 131 and the shield the electrodes 111 may at least partially overlap each other. The gate electrode 13 may surround the shield electrode vertical connector 11*v*. For example, the gate electrode 13 may be located around the shield electrode vertical connector 11*v*.

The source region 14 may be close to the surface 102 and located in the doped region 10*d*1. The source region 14 may be provided between the trenches. The source region 14 may be provided on the mesa between the trenches. The source region 14 and the doped region 10*d*1 may have opposite conductivity types. For example, the source region 14 may be doped with N-type impurities, and the doped region 10*d*1 may be doped with P-type impurities. Alternatively, the source region 14 may be doped with P-type impurities, and the doped region 10*d*1 may be doped with N-type impurities. For example, a P-N junction may be formed between the source region 14 and the doped region 10*d*1. In addition, the source region 14 and the drift region may have the same conductivity type, but the impurity concentration of the source region 14 may be higher than that of the drift region.

The center of the mesa may have a small trench for providing a source region vertical connector 14*v*. The source region vertical connector 14*v* may couple the source region 14 to the source metal layer S. A heavily doped region 10*d*2 may be formed between the source region vertical connector 14*v* and the doped region 10*d*1. The source region vertical connector 14*v* may vertically extend downward from the source metal layer S through the interlayer dielectric layer 15 and contact the heavily doped region 10*d*2. The heavily doped region 10*d*2 and the doped region 10*d*1 may have the same conductivity type, but the heavily doped region 10*d*2 may have impurity concentration higher than that of the doped region 10*d*1.

The interlayer dielectric layer 15 may be located on the surface 102. The interlayer dielectric layer 15 may be located between the surface 102 and the source metal layer S and gate metal layer G. The interlayer dielectric layer 15 may be partially covered by the source metal layer S and the gate metal layer G. The interlayer dielectric layer 15 may have a portion located between the source metal layer S and substrate 10, and another portion located between the gate metal layer G and the substrate 10.

The in-trench dielectric layer 12 may adjoin the interlayer dielectric layer 15 at the opening of the trench. The interlayer dielectric layer 15 may include the materials described above with respect to the in-trench dielectric layer 12. In some embodiments, the interlayer dielectric layer 15 and the in-trench dielectric layer 12 may be of the same material. In some embodiments, the interlayer dielectric layer 15 and the in-trench dielectric layer 12 may have different materials. In some embodiments, the interlayer dielectric layer 15 may be in a single-layer or multi-layer structure. When it is in the multi-layer structure, materials of the layers may be the same or different.

Figure 1B:
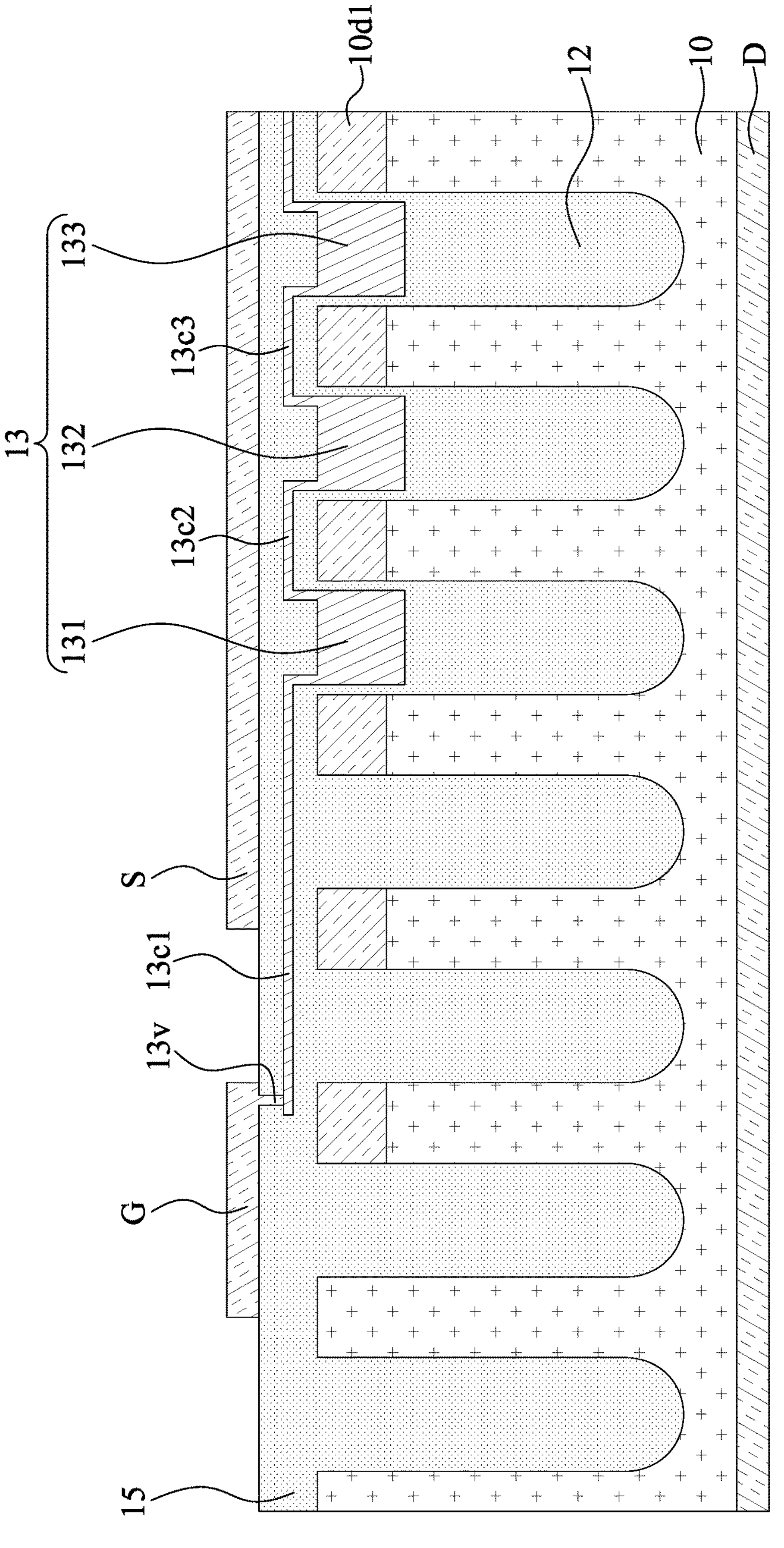
FIG. 1B is another cross-sectional view of an example vertical power semiconductor device according to some embodiments of the present application.
Figure 1C:
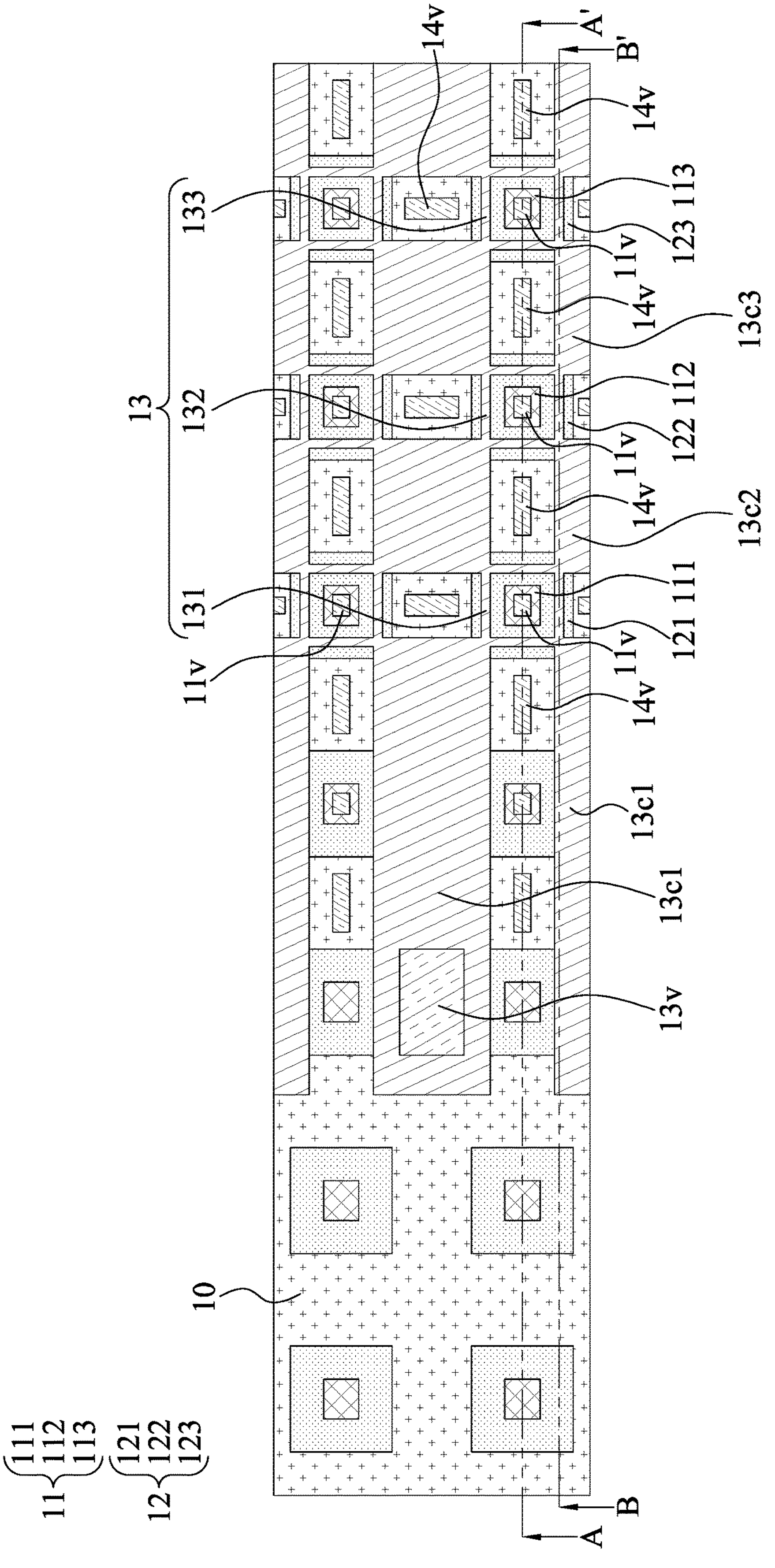
FIG. 1C is a top view of an example vertical power semiconductor device according to some embodiments of the present application.

FIG. 1B is a cross-sectional view of an example vertical power semiconductor device 1 according to some embodiments of the present application. FIG. 1C is a top view of a vertical power semiconductor device 1 according to some embodiments of the present application. In some embodiments, FIG. 1A and FIG. 1B are respective cross-sectional views of FIG. 1C along cutting lines AA' and BB'. The same or similar elements are marked with the same symbols, and detailed descriptions of the same or similar elements will not be repeated.

Referring to FIG. 1B, the gate electrode 13 (e.g., each of the gate electrodes 131, 132, 133) is coupled to the gate metal layer G via a gate electrode connector. The gate electrode connector passes through the interlayer dielectric layer 15. For example, the gate electrode 131 is coupled to the gate metal layer G via a horizontal connector 13*c*1 and a vertical connector 13*v*. The vertical connector 13*v* extends vertically downward from the gate metal layer G and through the interlayer dielectric layer 15, and contacts the horizontal connector 13*c*1. The horizontal connector 13*c*1 extends in between the vertical connector 13*v* and the gate electrode 131. The horizontal connector 13*c*1 may have a bending portion located at the opening of the trench. The bending portion may bend downward to contact the gate electrode 131.

For example, the gate electrode 132 is coupled to the gate electrode 131 through a horizontal connector 13*c*2, and is coupled to the gate metal layer G through the gate electrode 131, the horizontal connector 13*c*1 and the vertical connector 13*v*. The horizontal connector 13*c*2 extends in between the gate electrode 132 and the gate electrode 131. For example, the gate electrode 133 is coupled to the gate electrode 132 via a horizontal connection 13*c*3, and is coupled to the gate metal layer G through the gate electrode 132, the horizontal connector 13*c*2, the gate electrode 131, the horizontal connector 13*c*1 and the vertical connector 13*v*. The horizontal connector 13*c*3 extends in between the gate electrode 133 and the gate electrode 132. In some embodiments, the length of the horizontal connector 13*c*1 may be greater than the length of the horizontal connector 13*c*2. In some embodiments, the length of the horizontal connector 13*c*1 may be greater than the length of the horizontal connector 13*c*3. In some embodiments, since the horizontal connector 13*c*1 moves the connection nodes of the gate electrode 13 (for example, each of the gate electrodes 131, 132, 133) to the inactive or non-active area, the resistance of the vertical semiconductor power device 1 can be reduced.

Referring to FIG. 1C, the source region 14, the interlayer dielectric layer 15, the drain metal layer D, the source metal layer S and the gate metal layer G are omitted in FIG. 1C for simplicity. The boundary of the in-trench dielectric layer 12 (e.g., the boundary between each of the in-trench dielectric layers 121, 122, 123 and the substrate 10) may be the boundary of the trench. Although the boundary of the trench in FIG. 1C is shown to be square or rectangular, the disclosure is not limited thereto. Other shapes can be seen in FIG. 1D, FIG. 1E, and FIG. 1F, as examples.

The gate electrode 131 may be located in the in-trench dielectric layer 121 and surround the shield electrode 111. The in-trench dielectric layer 121 prevents the gate electrode 131 from directly adjoining the substrate 10 and the shield electrode 111. The gate electrode 132 may be located in the in-trench dielectric layer 122 and surround the shield electrode 112. The in-trench dielectric layer 122 prevents the gate electrode 132 from directly adjoining the substrate 10 and the shield electrode 112. The gate electrode 133 may be located in the in-trench dielectric layer 123 and surround the shield electrode 113. The in-trench dielectric layer 123 prevents the gate electrode 133 from directly adjoining the substrate 10 and the shield electrode 113.

The gate electrodes 13 (e.g., each of the gate electrodes 131, 132, 133) may be connected to each other. The horizontal connector 13*c*2 extends between the gate electrode 132 and the gate electrode 131. For example, the gate electrode 132 and the gate electrode 131 each have a terminal that is in contact with the horizontal connector 13*c*2. In some embodiments, the horizontal connector 13*c*2, the gate electrode 132 and the gate electrode 131 may be fabricated during the same process. For example, the horizontal connector 13*c*2, the gate electrode 132 and the gate electrode 131 may be integrally formed.

The horizontal connector 13*c*3 extends between the gate electrode 133 and the gate electrode 132. For example, the gate electrode 133 and the gate electrodes 132 each have a terminal that is in contact with the horizontal connector 13*c*3. In some embodiments, the horizontal connector 13*c*3, the gate electrode 133 and the gate electrode 132 may be fabricated during the same process. For example, the horizontal connector 13*c*3, the gate electrode 133 and the gate electrode 132 may be integrally formed.

In some embodiments, the horizontal connector 13*c*2 and the horizontal connector 13*c*3 may respectively extend in between four gate electrodes.

In some embodiments, the source region vertical connector 14*v* may be located in a mesa between the trenches. In some embodiments, the source region vertical connector 14*v* may not be covered by the gate electrode 13 or the horizontal connector of the gate electrode 13.

Figure 1D:
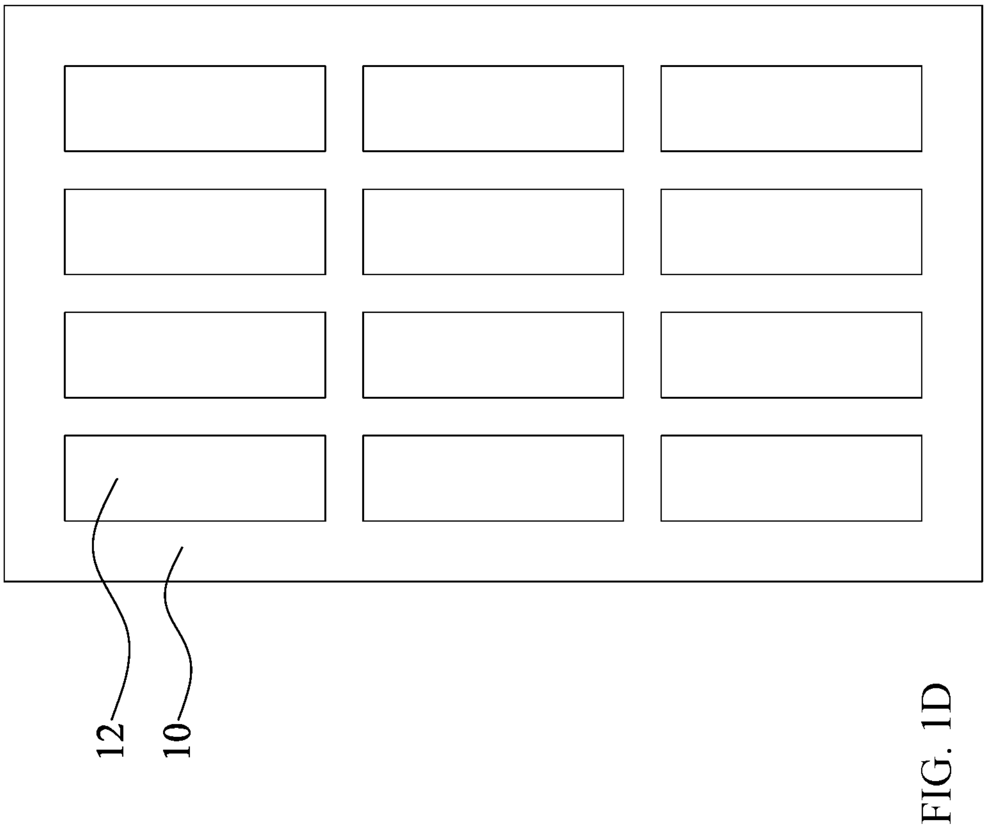
FIG. 1D is a top view of a portion of an example vertical power semiconductor device according to some embodiments of the present application.
Figure 1E:
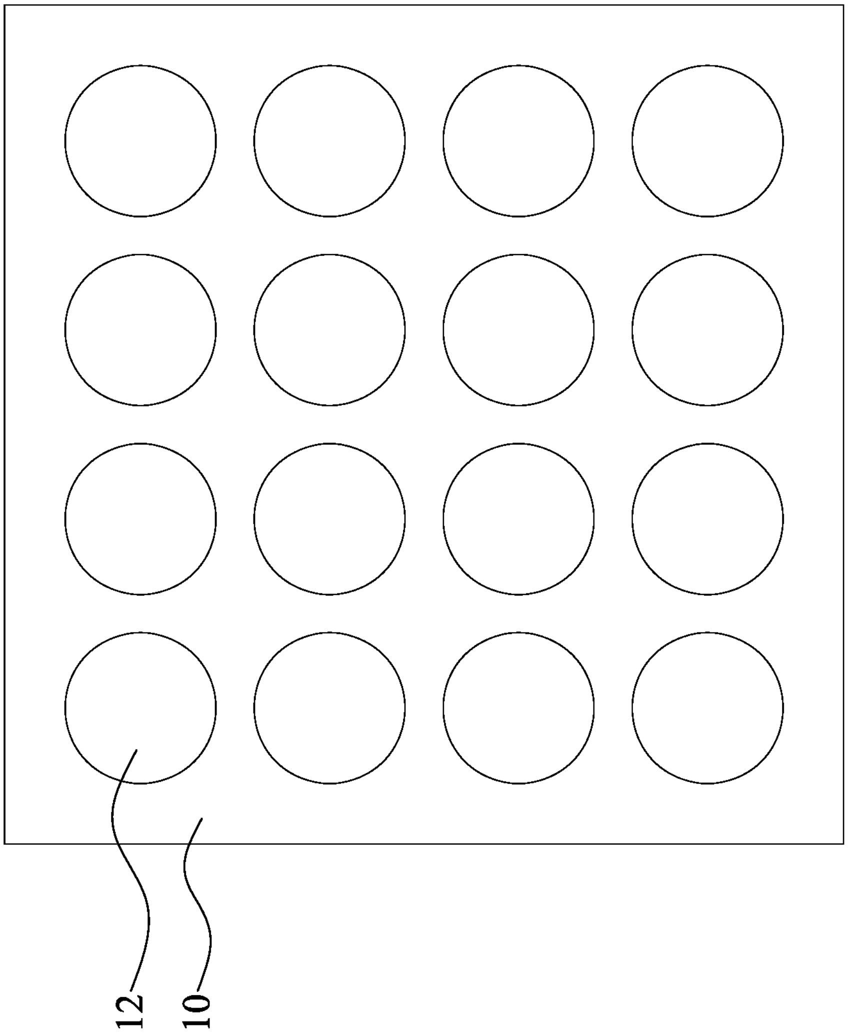
FIG. 1E is another top view of a portion of an example vertical power semiconductor device according to some embodiments of the present application.
Figure 1F:
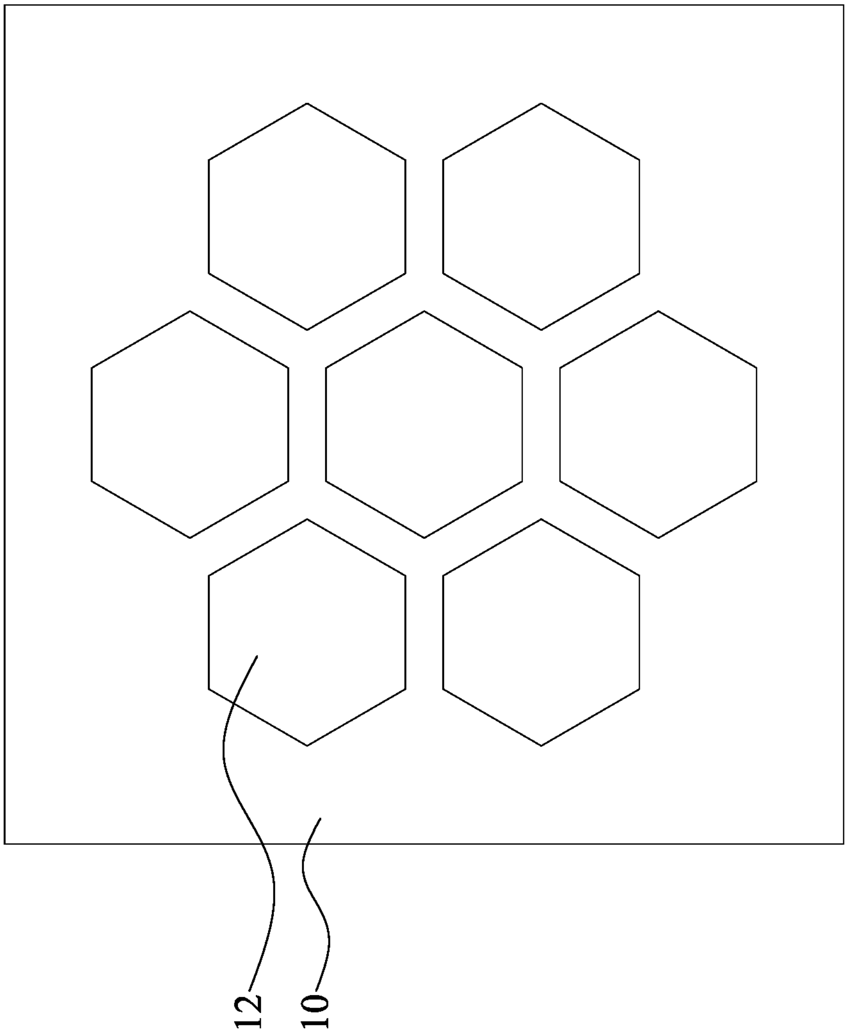
FIG. 1F is another top view of a portion of an example vertical power semiconductor device according to some embodiments of the present application.

FIGS. 1D, 1E, and 1F are diagrams showing top views of trenches of vertical power semiconductor devices according to some embodiments of the present application. The vertical power semiconductor devices may include trenches located in the substrate 10. The trenches are separated from each other. The in-trench dielectric layer 12 may be located in the trenches. In some embodiments, the trenches may be arranged in a matrix. The vertical power semiconductor devices of the present disclosure may have trenches arranged in a matrix of any number of columns or rows. In some embodiments, the top view of the trenches may be rectangular, circular, hexagonal or any shape. In some embodiments, the position, shape, ratio of occupied area, quantity of the trenches, and so on, may be adjusted in order to be applied in different circuits.

FIGS. 2A, 2B, 2C, 2D, 2E, 2F, 2G, 2H-1, 2H-2, 2I, 2J, 2K, 2L, 2M are diagrams showing one or more stages in a manufacturing method of a vertical power semiconductor device according to some embodiments of the present application. At least some of the figures have been simplified for the purpose of better understanding the aspects of the present disclosure.

Figure 2A:
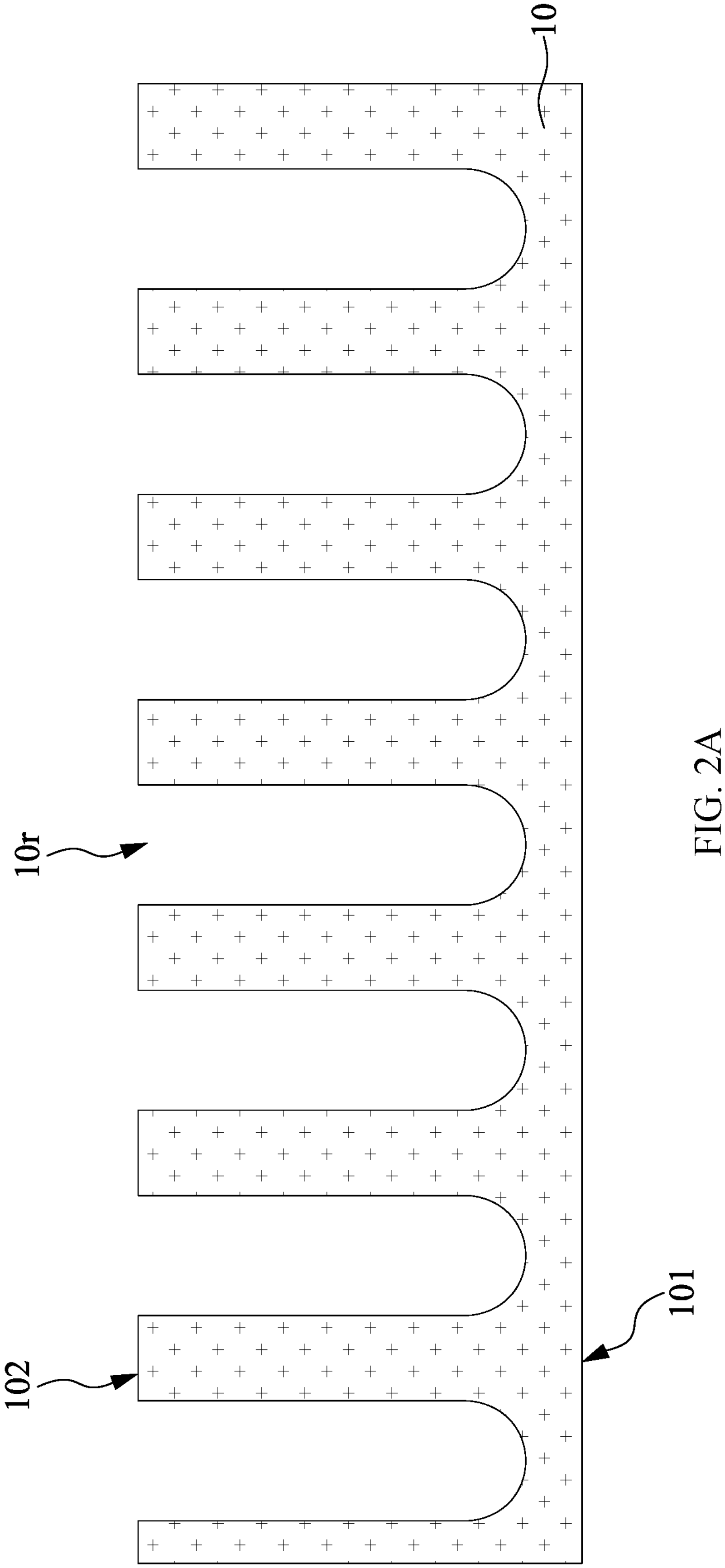
FIGS. 2A, 2B, 2C, 2D, 2E, 2F, 2G, 2H-1, 2H-2, 2I, 2J, 2K, 2L and 2M are diagrams illustrating a vertical power semiconductor device in one or more stages of manufacturing according to some embodiments of the present application.

Referring to FIG. 2A, the manufacturing method includes forming trenches 10*r* in a substrate 10. The substrate 10 may have a surface 101 and a surface 102 opposite to the surface 101. The trenches extend from the surface 101 to the surface 102. The trenches 10*r* may have vertical sidewalls. The trenches 10*r* may have arcuate bottom surfaces. In addition, the trenches 10*r* may be circular, elliptical, rectangular or polygonal. The trenches 10*r* may be formed through an etching process (such as a plasma dry etching process) after the positions and patterns are defined through photoresist.

Figure 2B:
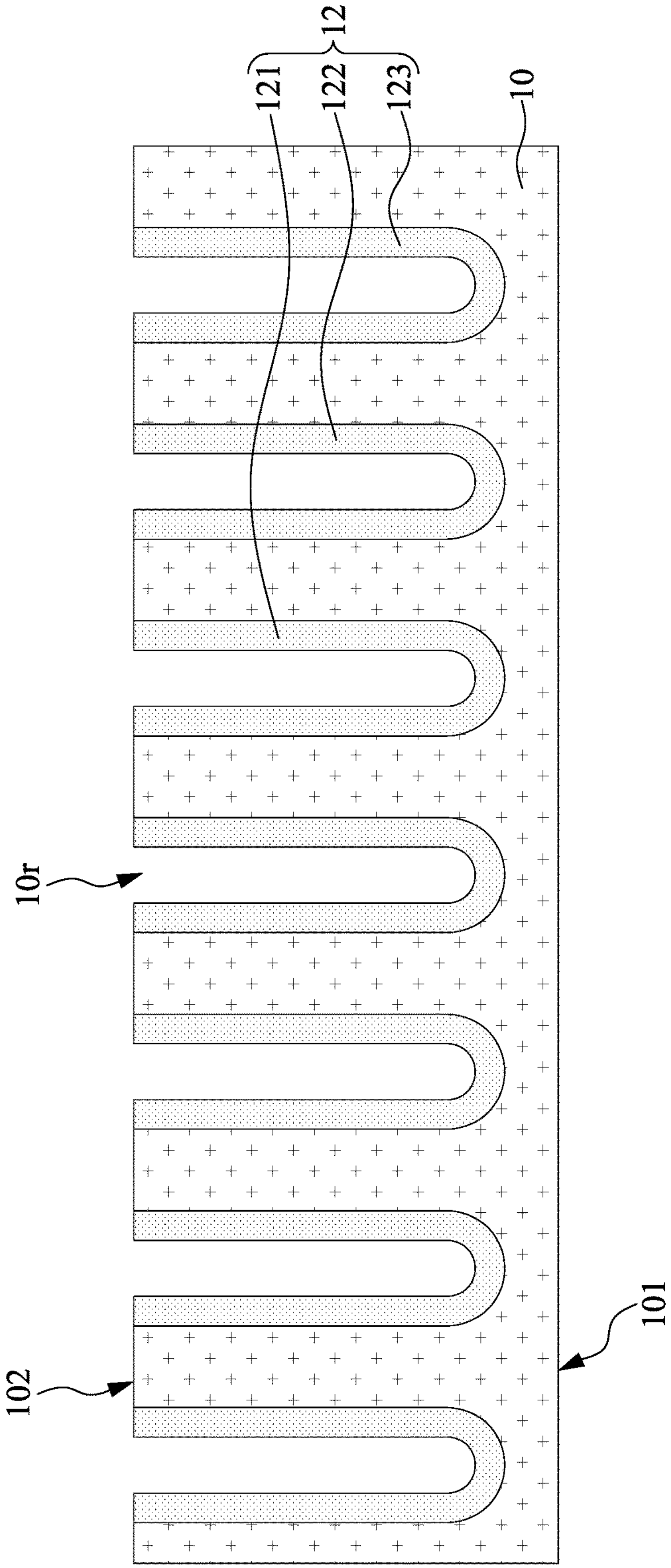

Referring to FIG. 2B, the manufacturing method includes forming an in-trench dielectric layer 12 (e.g., the in-trench dielectric layers 121, 122, 123) in the trenches 10*r*. In some embodiments, the in-trench dielectric layer 12 may be formed through atomic layer deposition (ALD), chemical vapor deposition (CVD) or other deposition processes. In some embodiments, the in-trench dielectric layer 12 may be formed using thermal oxidation techniques. In some embodiments, the in-trench dielectric layer 12 may be conformingly deposited on the inner surfaces of the trenches 10*r* (including the opposite sidewalls and extending on the bottom surface between the sidewalls). In some embodiments, the in-trench dielectric layer 12 may be filled into the trenches 10*r* through a deposition process, and then a lithography and etching process is carried out to partially remove the in-trench dielectric layer 12 to form at least one groove in the in-trench dielectric layer 12.

Figure 2C:
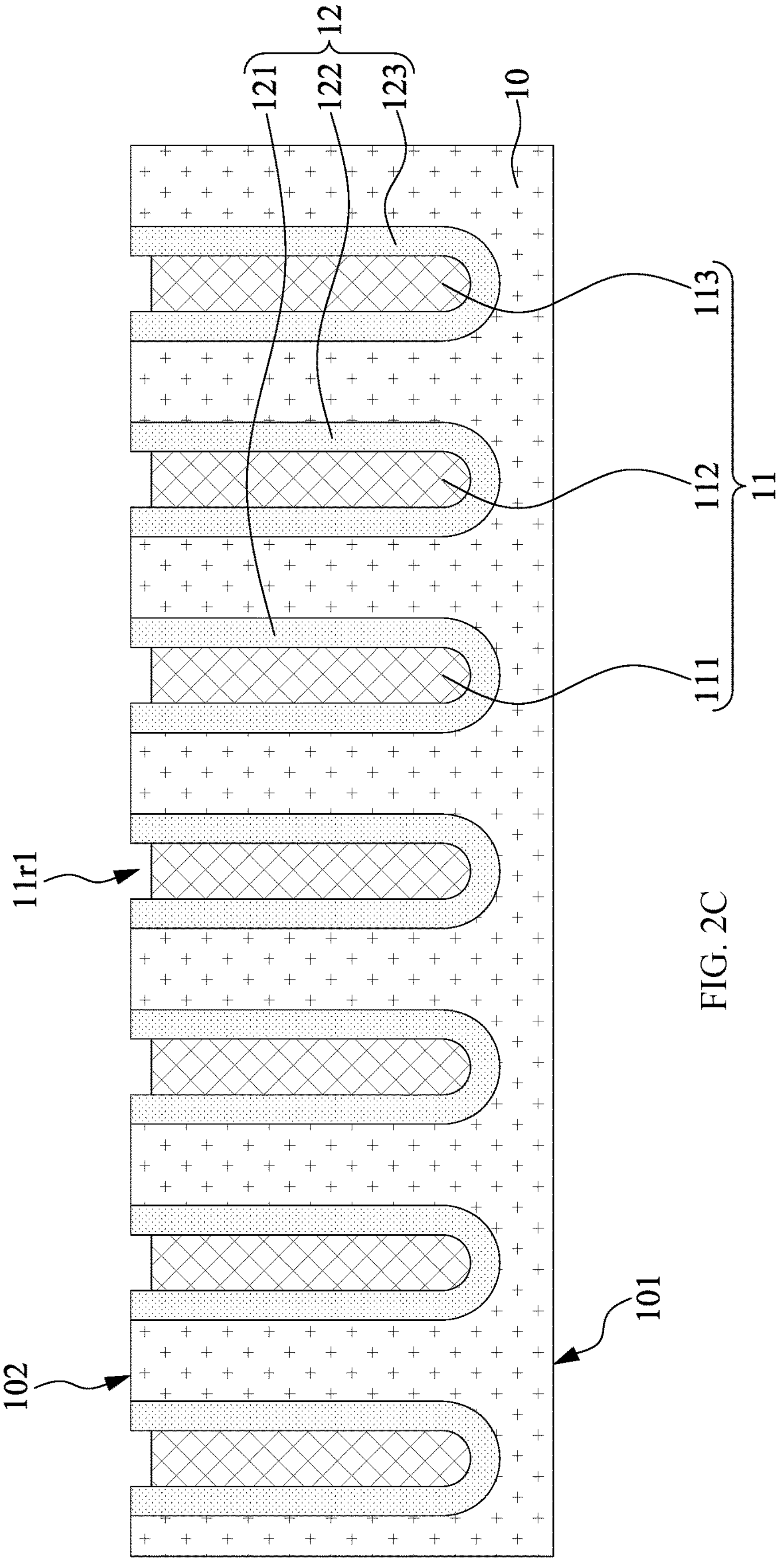

Referring to FIG. 2C, the manufacturing method includes forming a shield electrode 11 (e.g., shield electrodes 111, 112, 113). The in-trench dielectric layer 12 may surround the shield electrode 11. In some embodiments, the shield electrode 11 may be formed through physical vapor deposition (PVD), such as sputtering or spraying. In some embodiments, the shield electrode 11 may be formed by electroplating or CVD. In some embodiments, the shield electrode 11 may be partially removed to form grooves 11*r*1.

Figure 2D:
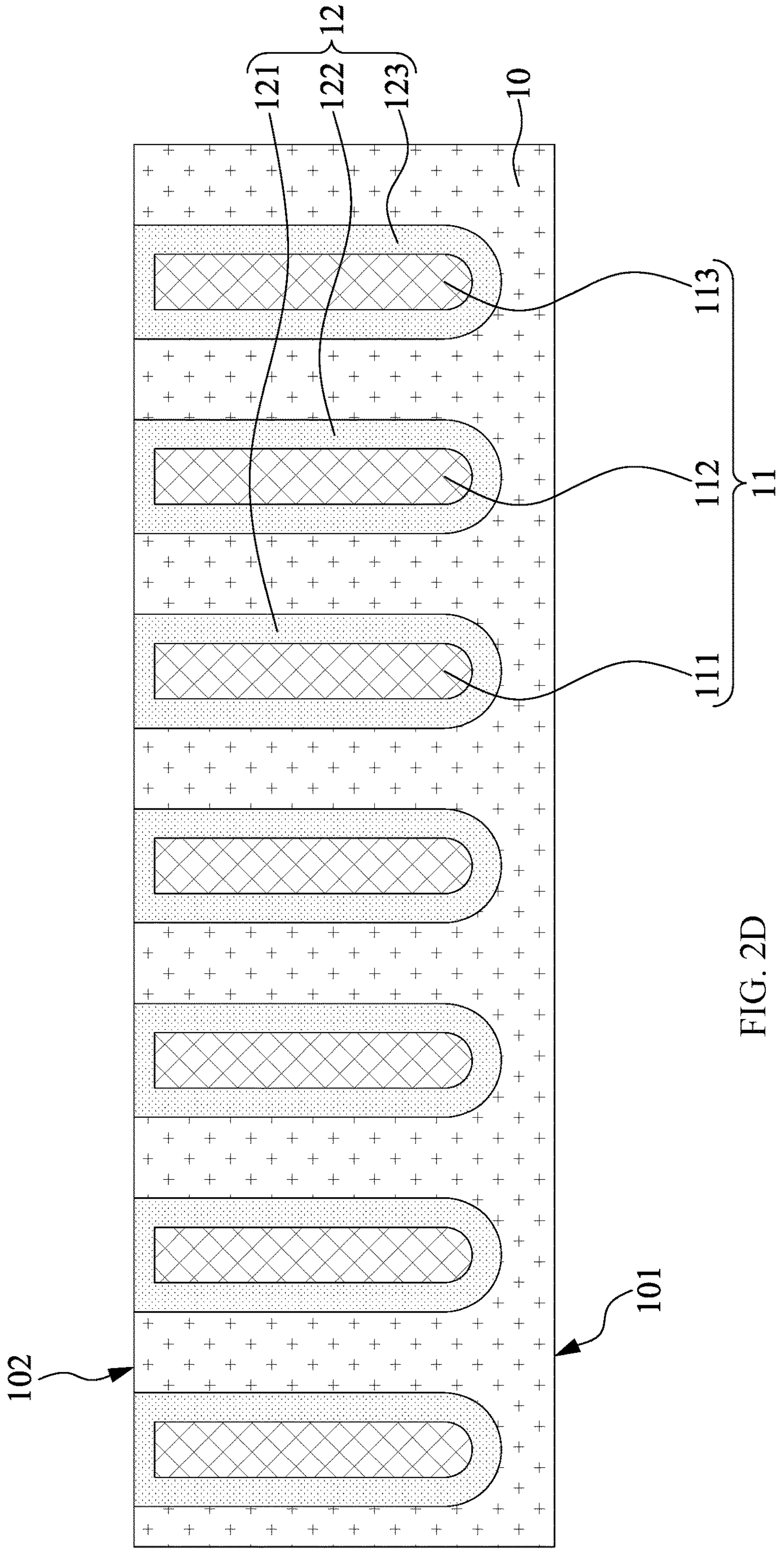

Referring to FIG. 2D, the manufacturing method includes depositing dielectric material of the in-trench dielectric layer 12 in the grooves 11*r*1 of FIG. 2C, such that the dielectric material fills up the remaining space of the trenches. The in-trench dielectric layer 12 may cover the substrate 10 and the top surface of the shield electrode 11. In some embodiments, a grinding process, such as a chemical mechanical polishing (CMP) process, may be used to remove, by grinding, the in-trench dielectric layer 12 that is outside the trenches.

Figure 2E:
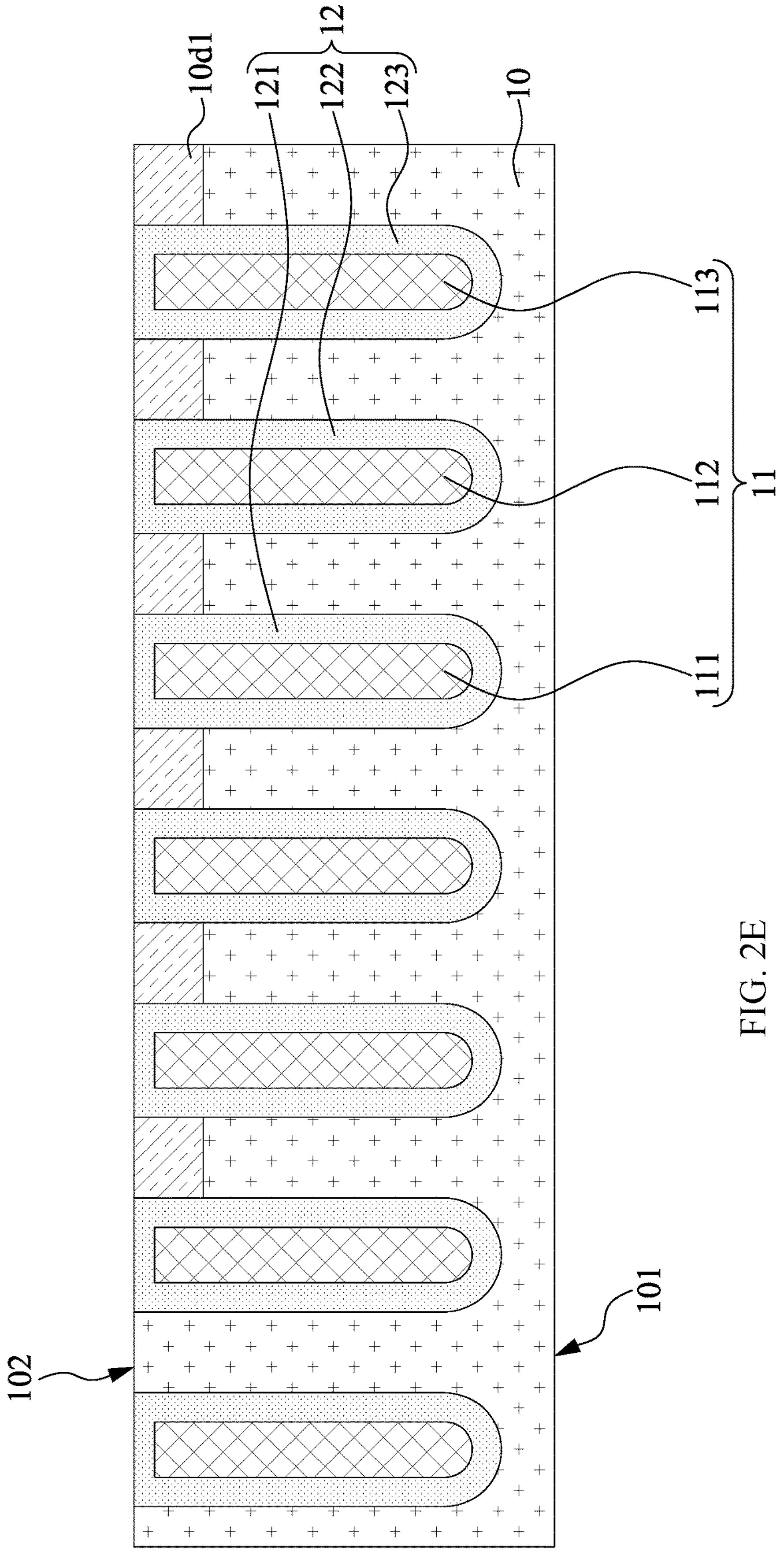

Referring to FIG. 2E, the manufacturing method includes forming doped regions 10*d*1 in the substrate 10. The doped regions 10*d*1 may form P-type or N-type doped regions through diffusing or an ion implantation process.

Figure 2F:
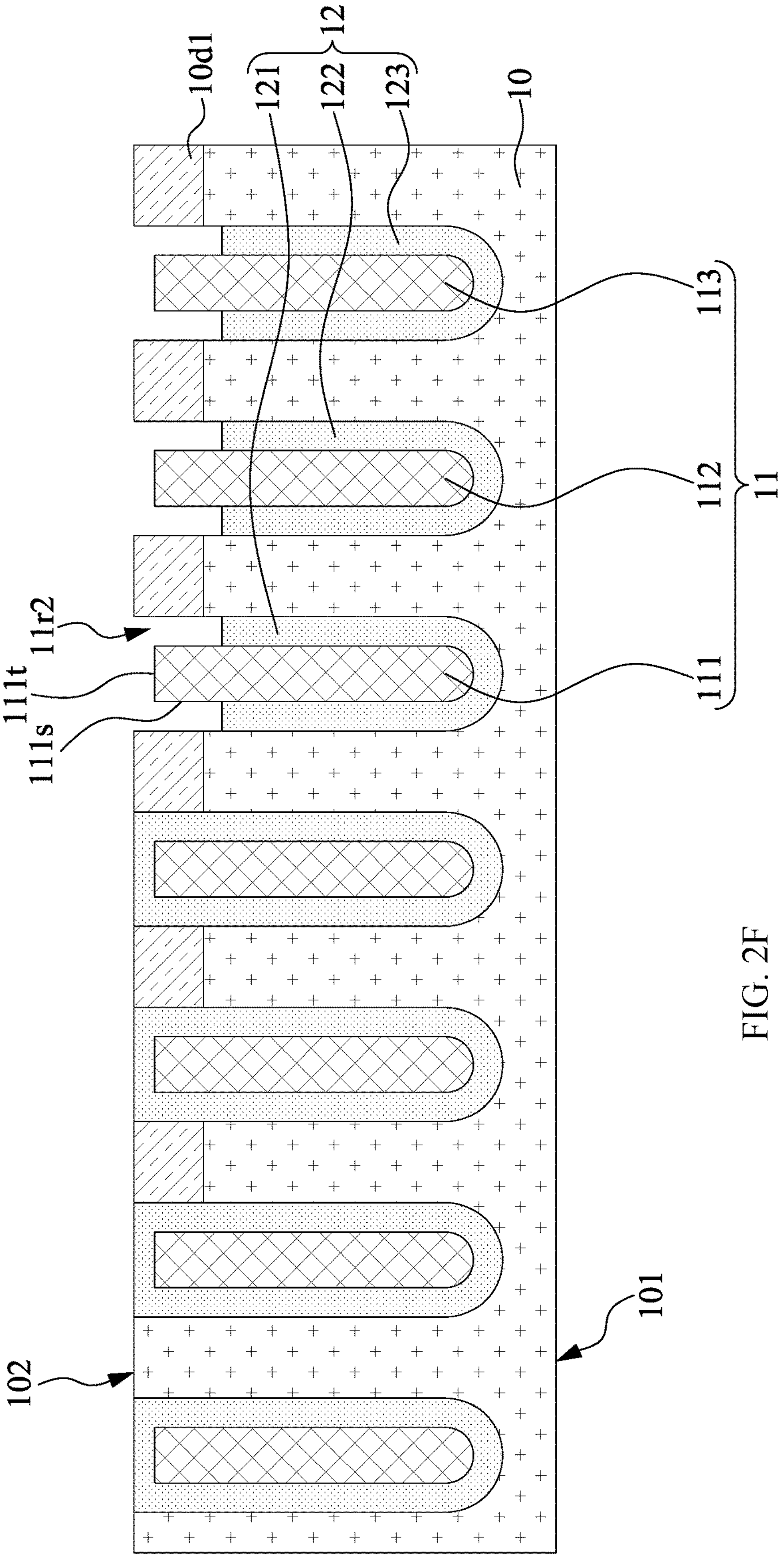

Referring to FIG. 2F, the manufacturing method includes partially removing the in-trench dielectric layer 12 to form grooves 11*r*2. In some embodiments, the grooves 11*r*2 may be formed through an etching process (e.g., etching back or recess etching) after the position and pattern are defined through photoresist. The top surfaces and partial side surfaces of the shield electrode 11 may be exposed from the grooves 11*r*2 or the in-trench dielectric layer 12. For example, the top surface 111*t* and the side surface 111*s* of the shield electrode 111 may be exposed from the groove 11*r*2 or the in-trench dielectric layer 121.

Figure 2G:
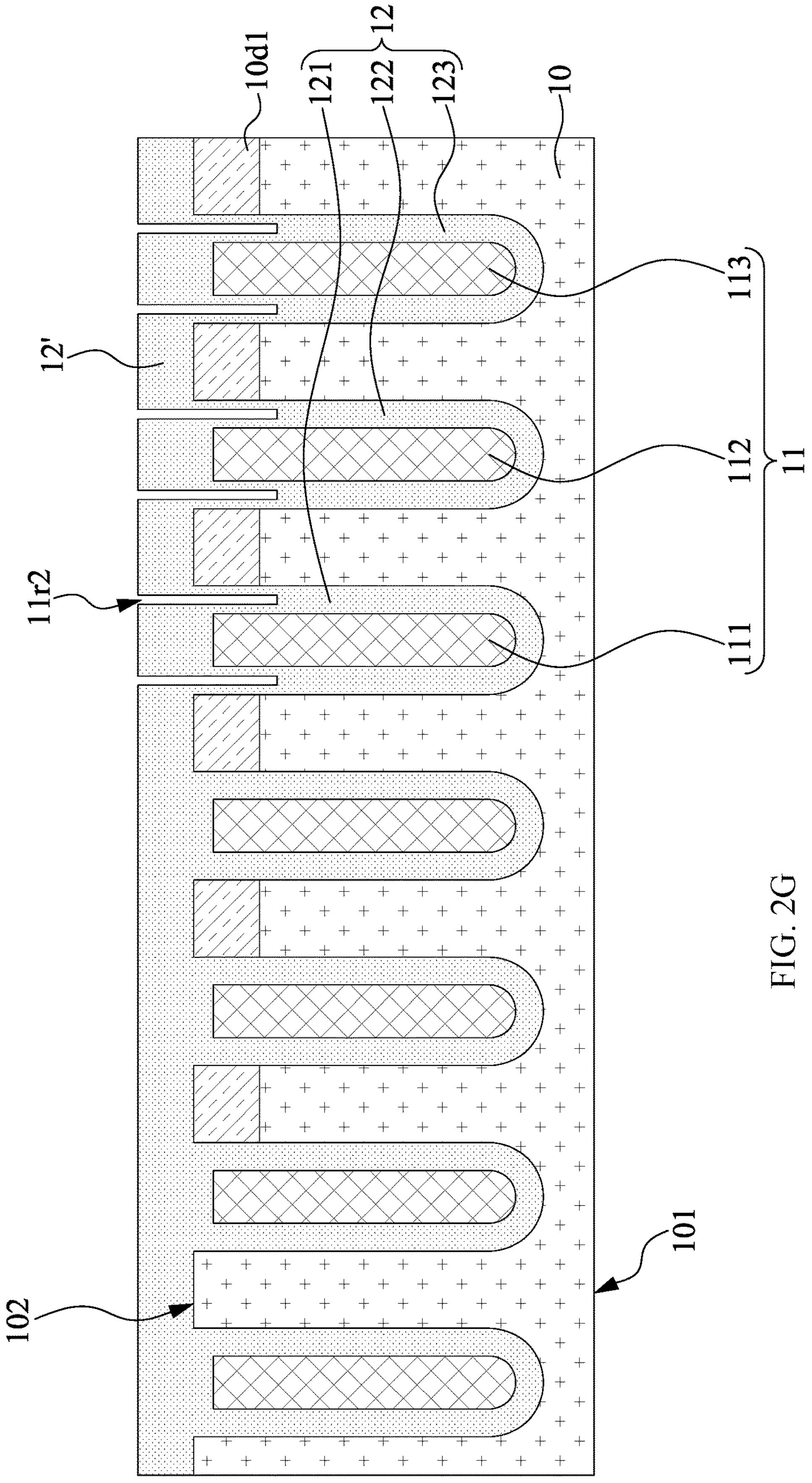

Referring to FIG. 2G, the manufacturing method includes depositing dielectric material 12' of the in-trench dielectric layer 12 on the surface 102 of the substrate 10 and in the grooves 11*r*2. The dielectric material 12' of the in-trench dielectric layer 12 may be formed along the inner surfaces of the grooves 11*r*2, and the top surfaces and partial side surfaces of the shield electrode 11. For example, the dielectric material 12' of the in-trench dielectric layer 12 may cover the shield electrode 11 that is exposed in FIG. 2F.

Figures 1, 2H:
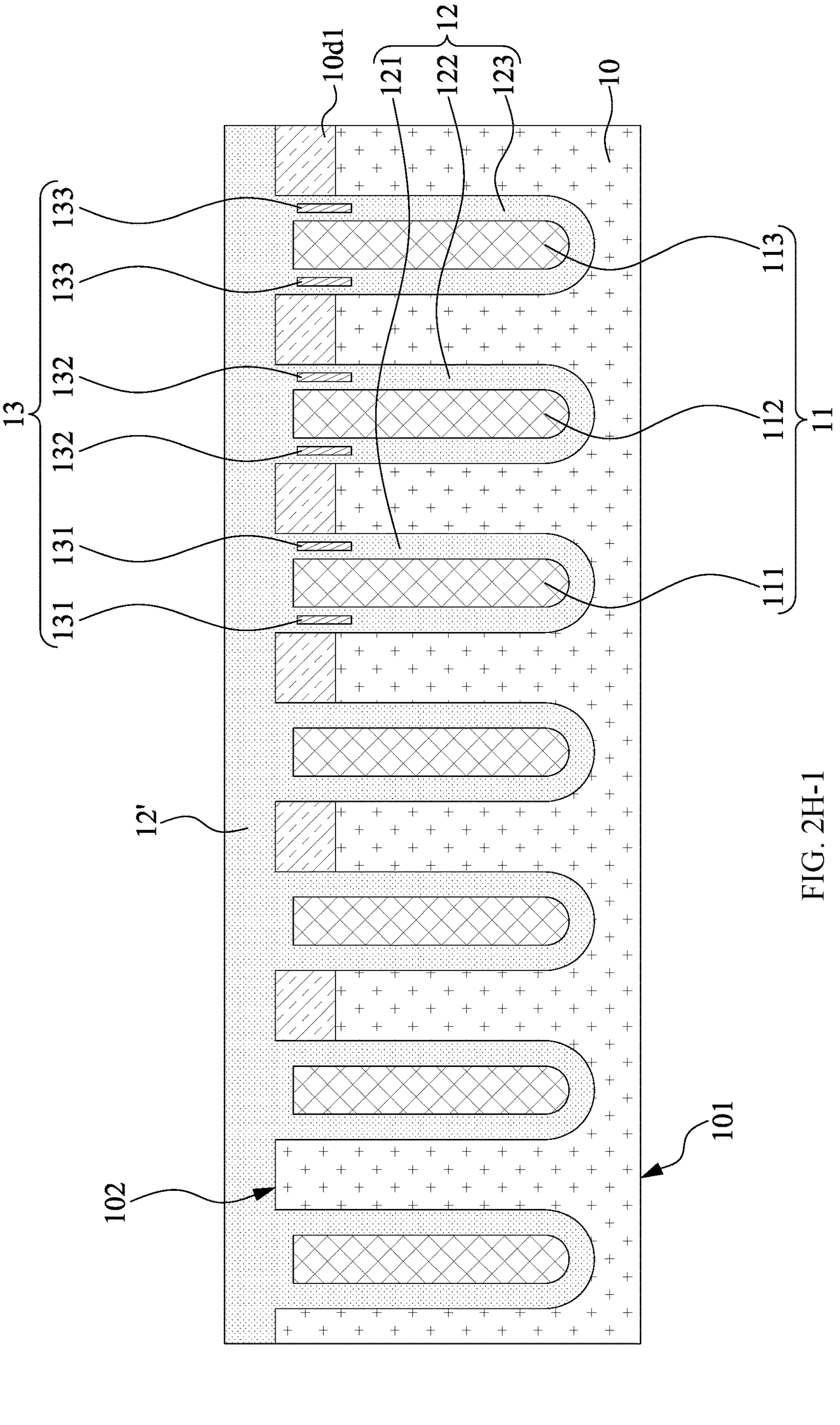
Figures 2, 2H:
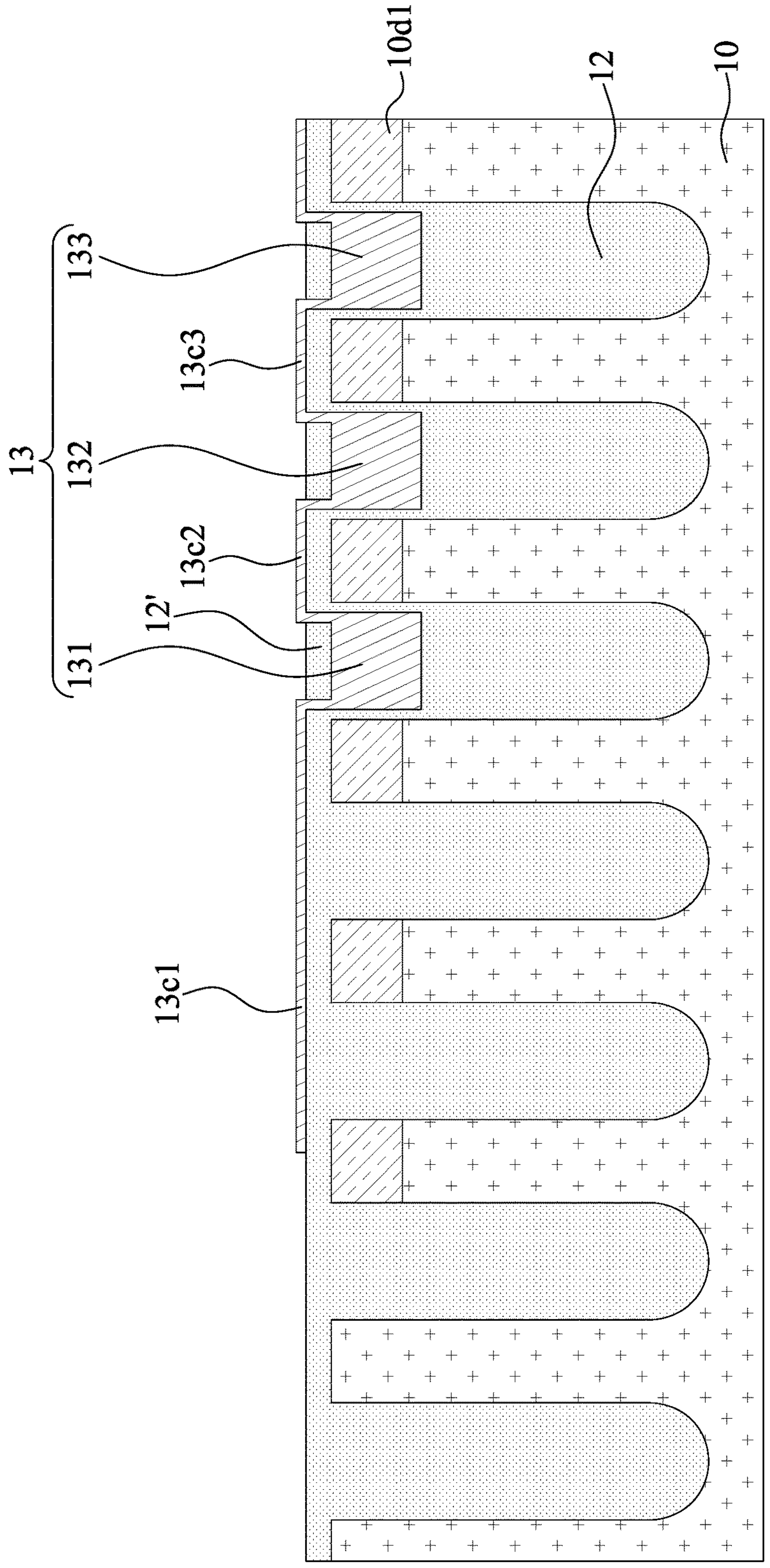

Referring to FIG. 2H-1 and FIG. 2H-2, the manufacturing method includes forming a gate electrode 13 in the trenches. The gate electrode 13 is surrounded by the in-trench dielectric layer 12, and does not directly adjoin the substrate 10 and the shield electrode 11. FIG. 2H-1 and FIG. 2H-2 are respective cross-sectional views of the device along different cutting lines, which correspond to cross-sectional views along cutting lines AA' and BB' in FIG. 1C. In some embodiments, the gate electrode 13 may be formed through PVD, such as sputtering or spraying. In some embodiments, the gate electrode 13 may be formed through electroplating or CVD. In some embodiments, the manufacturing method includes forming a horizontal connector 13*c*1 to connect to the gate electrode 131, form a horizontal connector 13*c*2 to connect the gate electrode 132 and the gate electrode 131, and form a horizontal connector 13*c*3 to connect the gate electrode 133 and the gate electrode 132. In some embodiments, the gate electrode 13 and the horizontal connectors of the gate electrode 13 may be made in the same process. For example, the gate electrode 13 and the horizontal connectors of the gate electrode 13 may be integrally formed.

Figure 2I:
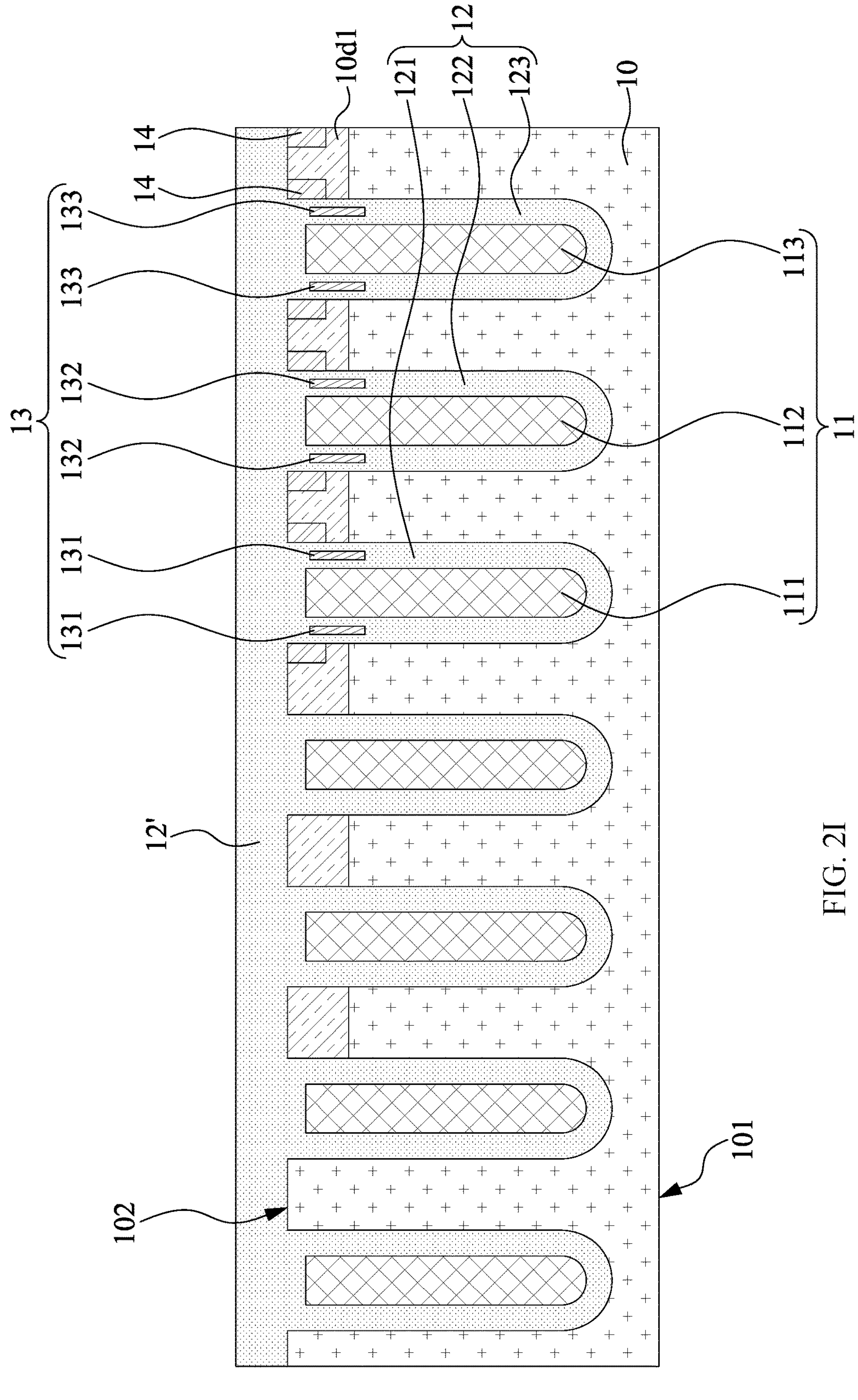

Referring to FIG. 2I, the manufacturing method includes forming source regions 14 in the doped regions 10*d*1. The source regions 14 may form P-type or N-type source regions through diffusing or the ion implantation process. P-N junctions may be formed between the source regions 14 and the doped regions 10*d*1.

Figure 2J:
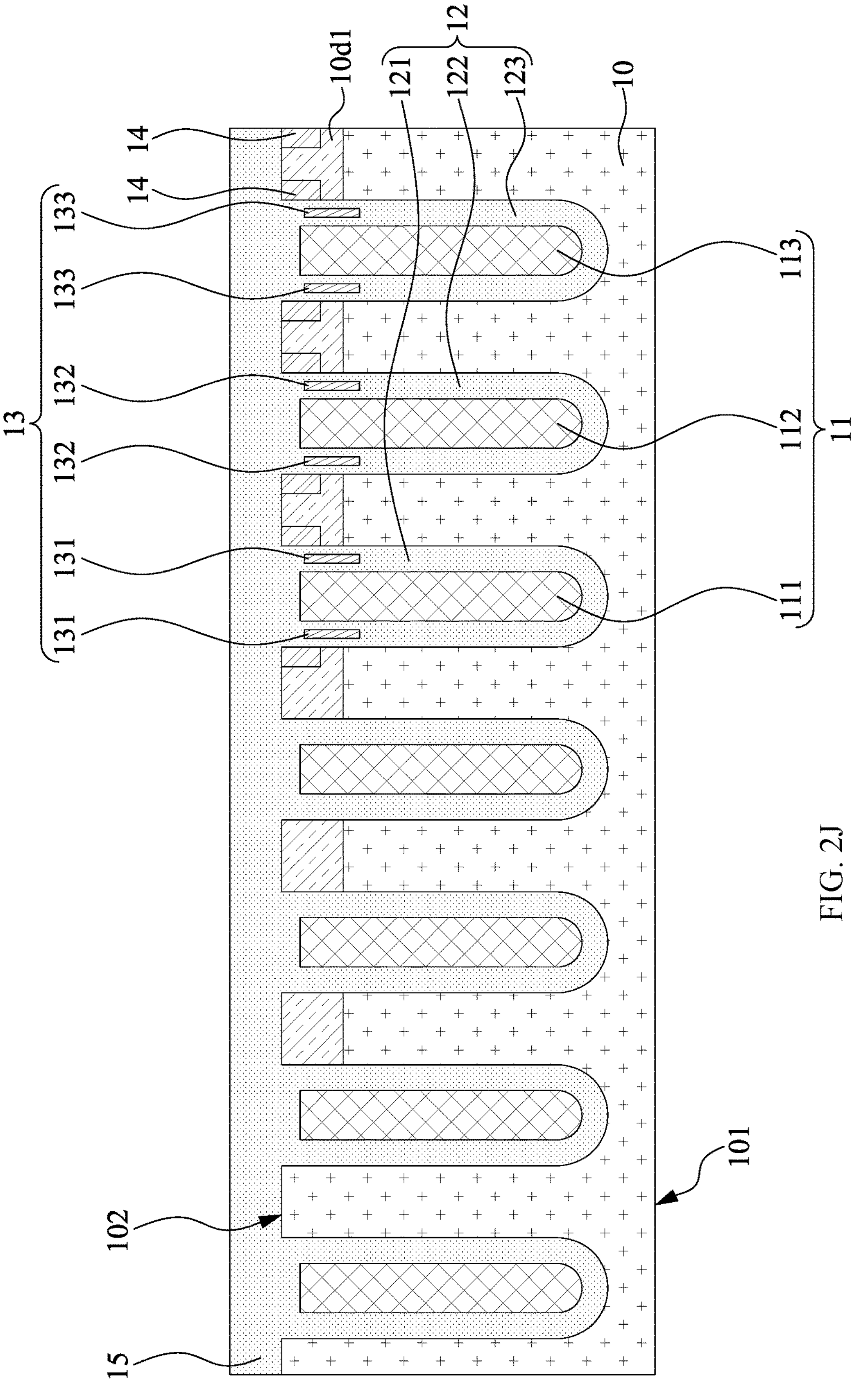

Referring to FIG. 2J, the manufacturing method includes forming an interlayer dielectric layer 15 on the surface 102 of the substrate 10. The interlayer dielectric layer 15 may be formed using ALD, CVD or other deposition processes.

Figure 2K:
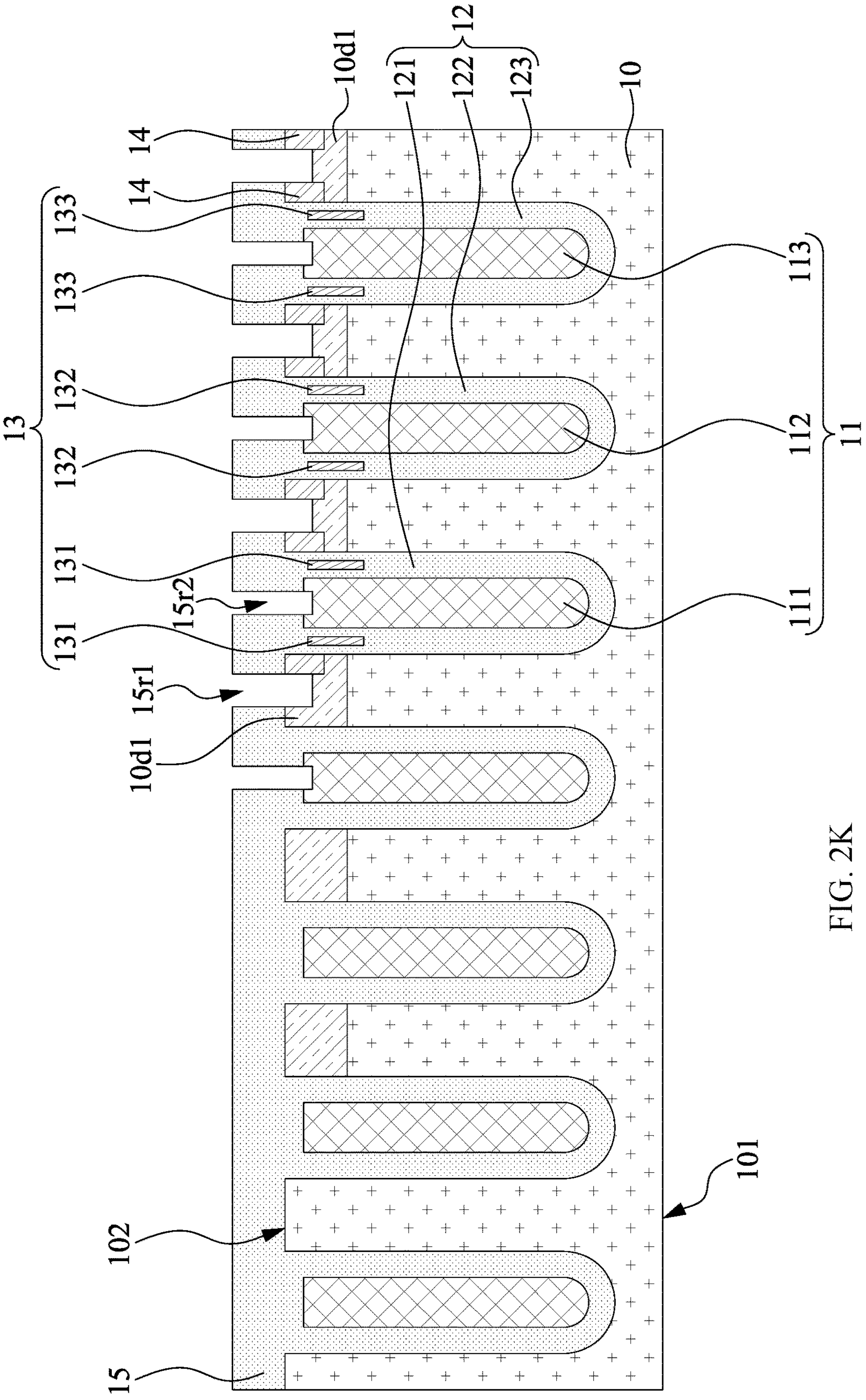

Referring to FIG. 2K, the manufacturing method includes partially removing the interlayer dielectric layer 15 to form openings 15*r*1 to expose the doped regions 10*d*1, and to form openings 15*r*2 to expose the shield electrode 11.

Figure 2L:
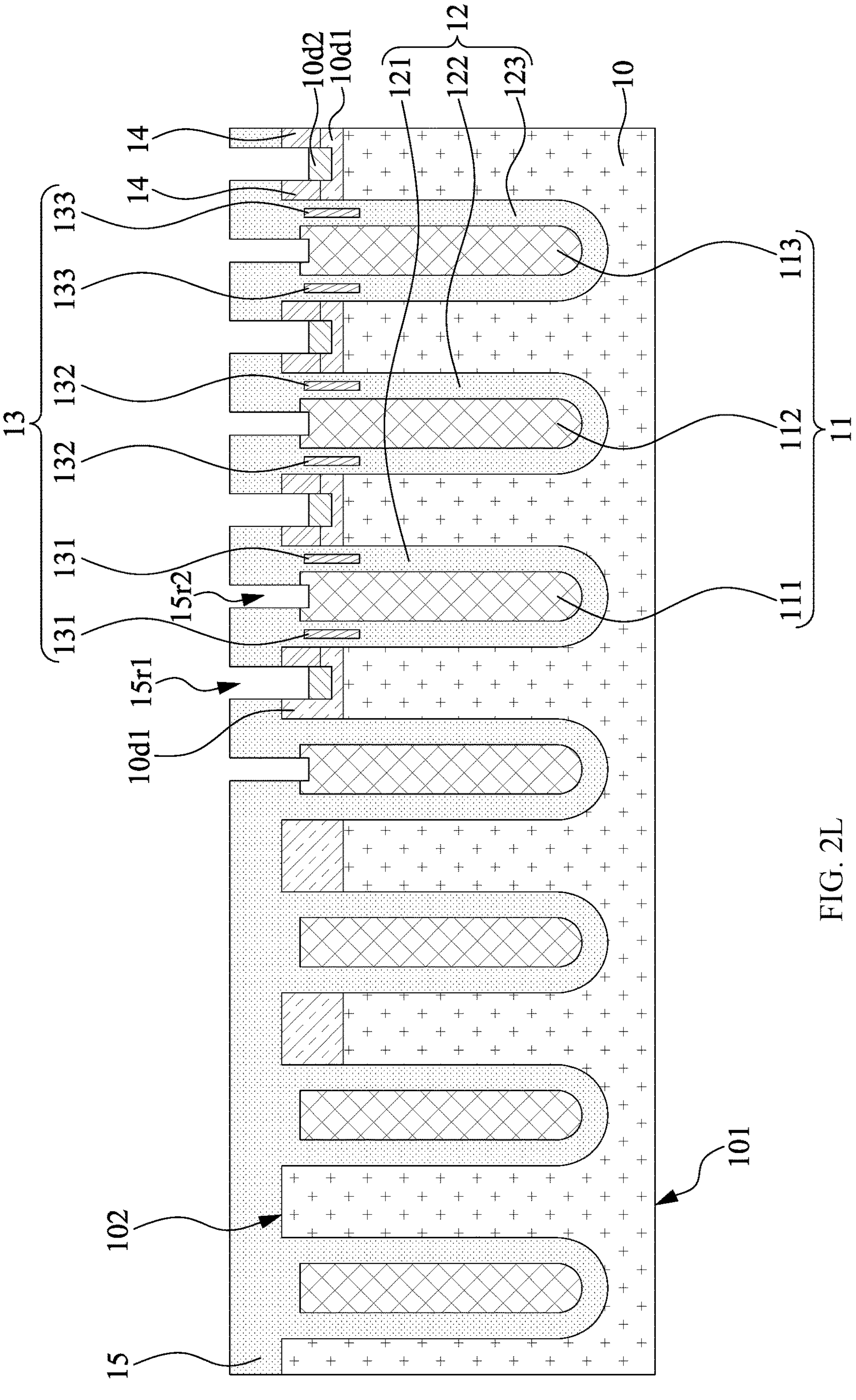

Referring to FIG. 2L, the manufacturing method includes forming heavily doped regions 10*d*2 in the doped regions 10*d*1. The heavily doped regions 10*d*2 may form P-type or N-type heavily doped regions through diffusing or the ion implantation process. The heavily doped regions 10*d*2 and the doped regions 10*d*1 may have the same conductivity type, and the impurity concentration of the heavily doped regions 10*d*2 may be higher than that of the doped regions 10*d*1.

Figure 2M:
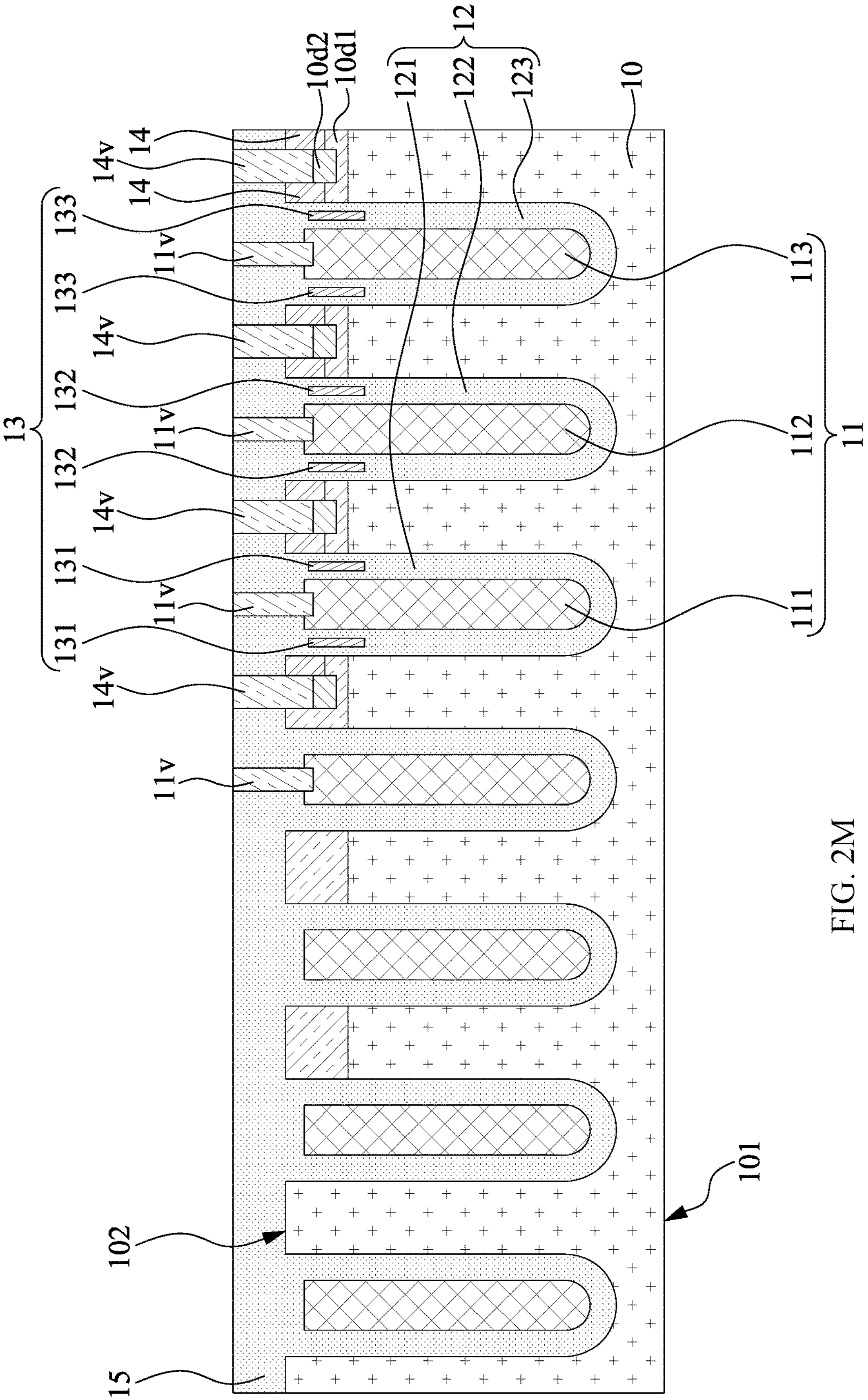

Referring to FIG. 2M, the manufacturing method includes forming source region vertical connectors 14*v* in the openings 15*r*1 to be in contact with the heavily doped regions 10*d*2 and the source regions 14. Shield electrode vertical connectors 11*v* are formed in the openings 15*r*2 to be in contact with the shield electrode 11. A source metal layer S and a gate metal layer G may then be formed on the interlayer dielectric layer 15, and a drain metal layer D may be formed on the surface 101 of the substrate 10. The source metal layer S may be in contact with the source region vertical connectors 14*v* and the shield electrode vertical connectors 11*v*.

The semiconductor structure formed through the above steps may be the same as the vertical power semiconductor devices illustrated in FIG. 1A, FIG. 1B and FIG. 1C.

For convenience of description, spatially relative terms, such as "below", "under", "lower", "above", "upper", "left side", "right side", and so on, may be used in the present disclosure to describe the relationship between one component or feature and another one or more components or features as shown in the accompanying drawings. In addition to the orientations depicted in the drawings, the spatially relative terms are also intended to cover different orientations of a device in use or operation. The device may be oriented in other ways (rotated 90 degrees or in other orientations), and the spatially relative terms used in the present disclosure may be interpreted similarly in a corresponding manner. It should be understood that when a component is referred to as being "connected to" or "coupled to" another component, it may be directly connected or coupled to another component, or an intervening component may be present.

As used herein, terms "about", "basically", "substantially" and "approximately" are used to describe and explain small variations. change. When used in connection with an event or instance, the terms may refer to an embodiment of exact occurrence of an event or instance as well as an embodiment where the event or instance is close to the occurrence. As used herein with respect to a given value or range, the term "about" generally refers to being within ±10%, ±5%, ±1%, or ±0.5% of the given value or range. A range herein may be referred to as being from one endpoint to the other or as being between two endpoints. All ranges disclosed herein are inclusive of endpoints unless otherwise indicated. The term "substantially coplanar" may mean that the difference of positions of two surfaces with reference to the same plane is within a few micrometers (μm), e.g., within 10 μm, within 5 μm, within 1 μm, or within 0.5 μm. When values or characteristics are referred to as being "substantially" the same, the term may refer to a value that is within ±10%, ±5%, ±1%, or ±0.5% of the mean of the values.

The foregoing has outlined features of several embodiments and detailed aspects of present disclosure. Embodiments described in the present disclosure may be readily used as a basis for designing or modifying other processes and structures in order to carry out the same or similar purposes and/or to achieve the same or similar advantages of the embodiments presented herein. Such equivalent constructions do not depart from the spirit and scope of the present disclosure, and various changes, substitutions, and alterations can be made without departing from the spirit and scope of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A vertical semiconductor power device, comprising:

a substrate, comprising a first surface and a second surface opposite to the first surface;

a first trench, extending from the second surface of the substrate into the substrate;

a first in-trench dielectric layer, disposed along an inner surface of the first trench;

a first shield electrode, disposed in the first trench and surrounded by the first in-trench dielectric layer;

a first gate electrode, disposed in the first in-trench dielectric layer, surrounding the first shield electrode, and separated from the first shield electrode by the first in-trench dielectric layer;

a second trench, extending from the second surface of the substrate into the substrate and spaced apart from the first trench;

a second in-trench dielectric layer, disposed along an inner surface of the second trench;

a second shield electrode, disposed in the second trench and surrounded by the second in-trench dielectric layer;

a second gate electrode, disposed in the second in-trench dielectric layer, surrounding the second shield electrode, and separated from the second shield electrode by the second in-trench dielectric layer;

a doped region disposed in the substrate between the first trench and the second trench;

a source region, disposed in the doped region between the first trench and the second trench; and an interlayer dielectric layer disposed on and covering the second surface of the substrate, the first trench and the second trench;

a source metal layer on and in contact with the interlayer dielectric layer and covering the first trench and the second trench;

a gate metal layer on and in contact with the interlayer dielectric layer without overlapping with the first trench and the second trench; and a gate electrode connector comprising a vertical connector, a first horizontal connector and a second horizontal connector, the vertical connector coupled between the gate metal layer and the first horizontal connector, the first horizontal connector coupled between the first gate electrode and the vertical connection, and the second horizontal connector coupled between the first gate electrode and the second gate electrode without overlapping with the gate metal layer.

2. The vertical semiconductor power device of claim 1, further comprising:

a drain metal layer on the first surface of the substrate.

3. The vertical semiconductor power device of claim 1, wherein the first in-trench dielectric layer adjoins the interlayer dielectric layer at an opening of the first trench.

4. The vertical semiconductor power device of claim 1, wherein the gate electrode connector extends through the interlayer dielectric layer.

5. The vertical semiconductor power device of claim 1, wherein the first in-trench dielectric layer and the second in-trench dielectric layer each have a shape of a square, rectangular, circle, or hexagon.

6. The vertical semiconductor power device of claim 1, wherein the interlayer dielectric layer has material different from that of the first and second in-trench dielectric layers.

7. The vertical semiconductor power device of claim 1, wherein the first horizontal connector has a length greater than the second horizontal connector.

8. The vertical semiconductor power device of claim 1, wherein the source metal layer covers a first portion of the interlayer dielectric layer between the substrate and the source metal layer, and covers only a portion of the first horizontal connector.

9. The vertical semiconductor power device of claim 8, wherein the gate metal layer is separated from the source metal layer on the interlayer dielectric layer with a gap in between, and the gap overlaps with the first horizontal connector.

10. The vertical semiconductor power device of claim 1, further comprising:

a first shield electrode vertical connector extending through the interlayer dielectric layer, and coupled between the source metal layer and the first shield electrode.

11. The vertical semiconductor power device of claim 10, wherein the first gate electrode surrounds the first shield electrode vertical connector in the direction from the second surface to the first surface.

12. The vertical semiconductor power device of claim 10, further comprising:

a second shield electrode vertical connector extending through the interlayer dielectric layer, and coupled between the source metal layer and the second shield electrode.

13. The vertical semiconductor power device of claim 1, further comprising:

a source region vertical connector coupled between the source metal layer and the source region; and a heavily doped region, formed between the source region vertical connector and the doped region.

14. The vertical semiconductor power device of claim 13, wherein the source region vertical connector extends, from the source metal layer, through a portion of the source region and is in contact with the heavily doped region.

15. The vertical semiconductor power device of claim 13, wherein the heavily doped region comprises a first portion below and in contact with the source region vertical connector and positioned higher than a bottom of the source region, and a second portion below and connected to the first portion and positioned below the bottom of the source region.

16. The vertical semiconductor power device of claim 13, wherein the heavily doped region and the doped region have a same conductivity type.

17. The vertical semiconductor power device of claim 1, further comprising:

a third trench, extending from the second surface of the substrate into the substrate;

a third in-trench dielectric layer, disposed along an inner surface of the third trench;

a third shield electrode, disposed in the third trench and surrounded by the third in-trench dielectric layer; and a third gate electrode, disposed in the third in-trench dielectric layer, surrounding the third shield electrode, and separated from the third shield electrode by the third in-trench dielectric layer.

18. The vertical semiconductor power device of claim 17, wherein the gate electrode connector further comprises a third horizontal connector coupled between the second gate electrode and the third gate electrode.

19. The vertical semiconductor power device of claim 18, wherein the second horizontal connector and the third horizontal connector overlap with the source metal layer without overlapping with the gate metal layer.

20. The vertical semiconductor power device of claim 17, further comprising:

a third shield electrode vertical connector extending through the interlayer dielectric layer, and coupled between the source metal layer and the third shield electrode.

* * * * *